(12) United States Patent
Shindo et al.

(10) Patent No.: US 6,690,571 B2
(45) Date of Patent: Feb. 10, 2004

(54) LAMINATE-TYPE DIELECTRIC DEVICE, A PRODUCTION METHOD AND AN ELECTRODE PASTE MATERIAL

(75) Inventors: Hitoshi Shindo, Nishio (JP); Etsuro Yasuda, Nishio (JP); Atsuhiro Sumiya, Nishio (JP); Takashi Yamamoto, Chiryu (JP); Toshiatsu Nagaya, Kuwana (JP)

(73) Assignees: Denso Corporation, Kariya (JP); Nippon Soken, Inc., Nishio (JP)

( * ) Notice: Subject to any disclaimer, the term of this patent is extended or adjusted under 35 U.S.C. 154(b) by 0 days.

(21) Appl. No.: 10/028,992

(22) Filed: Dec. 28, 2001

(65) Prior Publication Data
US 2002/0149901 A1 Oct. 17, 2002

(30) Foreign Application Priority Data

Dec. 28, 2000 (JP) .......................... 2000-400209
Nov. 22, 2001 (JP) .......................... 2001-358316

(51) Int. Cl.⁷ ................................. H01G 4/06
(52) U.S. Cl. ............... 361/311; 361/321.2; 361/321.5
(58) Field of Search ........... 361/311–313, 321.1–321.5, 361/322; 423/44 R

(56) References Cited

U.S. PATENT DOCUMENTS 5,510,651 A  *  4/1996  Maniar et al. ............... 257/751
6,214,724 B1 *  4/2001  Nakajima .................... 438/656
6,268,258 B1 *  7/2001  Joo et al. ..................... 438/381
6,329,277 B1 * 12/2001  Liu et al. ..................... 438/612

FOREIGN PATENT DOCUMENTS

| JP | A-5055077 | 3/1993 |
| JP | A-5-190375 | 7/1993 |
| JP | A-5-234414 | 9/1993 |
| JP | A-5-242724 | 9/1993 |
| JP | A-5-283274 | 10/1993 |
| JP | A-5-304043 | 11/1993 |
| JP | A-6-290985 | 10/1994 |
| JP | A-7-230714 | 8/1995 |
| JP | A-8-255509 | 10/1996 |

* cited by examiner

Primary Examiner—Anthony Dinkins
(74) Attorney, Agent, or Firm—Nixon & Vanderhye P.C.

(57) ABSTRACT

A laminate type dielectric device is formed by alternately laminating dielectric ceramic layers and electrode layers and integrally baking the laminate product. The electrode layers are mainly made of an electrically conductive base metal material having greater standard Gibbs free energy for the formation of a metal oxide at a baking temperature than that of the ceramic material constituting the dielectric ceramic layers. Segregation of the materials including the electrically conductive base metal material does not occur at portions sandwiched between adjacent positive and negative electrode layers among the dielectric ceramic layers.

37 Claims, 22 Drawing Sheets

Cu DISTRIBUTION

O DISTRIBUTION

Cu DISTRIBUTION

O DISTRIBUTION

Cu DISTRIBUTION

O DISTRIBUTION

Cu DISTRIBUTION

O DISTRIBUTION

Cu DISTRIBUTION

O DISTRIBUTION

Cu DISTRIBUTION

O DISTRIBUTION

Cu DISTRIBUTION

O DISTRIBUTION

Cu DISTRIBUTION

O DISTRIBUTION

Cu DISTRIBUTION

O DISTRIBUTION

Cu DISTRIBUTION

O DISTRIBUTION

Cu DISTRIBUTION

O DISTRIBUTION

Cu DISTRIBUTION

O DISTRIBUTION

Cu DISTRIBUTION

O DISTRIBUTION

Cu DISTRIBUTION

O DISTRIBUTION

Cu DISTRIBUTION

Ti DISTRIBUTION

Mg DISTRIBUTION

Ca DISTRIBUTION

Cu DISTRIBUTION

Cu DISTRIBUTION

Cu DISTRIBUTION

LAMINATE-TYPE DIELECTRIC DEVICE, A PRODUCTION METHOD AND AN ELECTRODE PASTE MATERIAL

BACKGROUND OF THE INVENTION

1. Field of the Invention

This invention relates to a laminate type dielectric device such as a laminate-type capacitor, a laminate-type piezoelectric actuator, etc, a production method, and an electrode paste material for forming an electrode layer of the dielectric device.

2. Description of the Related Art

A laminate-type dielectric device produced by alternately laminating dielectric ceramic layers having various dielectric properties and electrode layers have been widely used in the past. Known electrode materials for forming these electrode layers include Pt, Pd, Ag, Ni, Cu, their mixtures and their alloys.

The problems encountered in producing the electrodes vary from electrode material to electrode material. Silver (Ag), for example, has a high dielectric constant and is relatively economical. However, Ag has a low melting point of 980° C. and is likely to invite migration and, therefore, has low reliability.

In contrast, palladium (Pd) is expensive but has a high melting point. Pd has therefore been used in the form of an Ag—Pd metal material to suppress migration and to raise the melting point of the electrode material (refer to Japanese Unexamined Patent Publication (Kokai) No. 5-304043).

The addition of Pd can suppress migration, it is true, but bonding is not sufficient between the electrode material and a ceramic material. Various measures have been taken to cope with this problem as described in Japanese Unexamined Patent Publications (Kokai) Nos. 5-304043 and 8-255509.

Nickel (Ni) involves the problems such as the occurrence of cracking and deformation and so-called "islanding" of the electrode due to superheating (rapid sintering of Ni at a temperature exceeding 1,000° C.). To cope with the problems, Japanese Unexamined Patent Publication (Kokai) No. 5-55077 proposes to mix Ni and NiO, and Japanese Unexamined Patent Publication (Kokai) No. 6-290985 proposes to add an oxide of a rare earth element.

Among them, the prior art technology using Ag aims at solving the problem that results from Ag, and the prior art technology using Ni aims at solving the problem of the superheating of Ni that is peculiar to Ni. However, these materials are expensive and, as long as these materials are used, it will be difficult to reduce the production cost of the laminate type dielectric device that has been widely used.

On the other hand, copper (Cu) could be a promising material among base metals as the economical electrode material. In connection with Cu-containing paste materials or electrodes, a technology is known that suppresses the occurrence of cracking resulting from oxidation expansion of Cu by mixing Cu and $C_2O$ in a suitable proportion (Japanese Unexamined Patent Publication (Kokai) No. 5-283274). Further, there are also known a method that forms a complex by using an organic phosphorus compound a metal (Cu) ion, and baking the complex to assist sintering of ceramics and to make the film thickness uniform (Japanese Unexamined Patent Publication (Kokai) No. 5-242724), and a method that suppresses the occurrence of warping and cracking of the device by limiting the Cu content to 40 to 70 wt % to reduce the coating thickness (Japanese Unexamined Patent Publication (Kokai) No. 5-234414).

Still another known technology uses a paste material containing 40 to 60 wt % of Cu powder having a mean particle diameter of 0.5 to 2 $\mu$m and a particle size distribution of 0.3 to 4 $\mu$m where the paste material is baked to a film thickness of 1 to 3 $\mu$m so as to (1) suppress the occurrence of voids between the device and the electrode and inside the electrode, (2) suppress the occurrence of breakage of the electrode resulting from warp of inner and outer electrodes, (3) prevent deformation of a ceramic component itself and (4) prevent inferior contact between the inner electrode and the outer electrode (Japanese Unexamined Patent Publication (Kokai) No. 5-190375). The methods and objects of using Cu electrodes are very diversified.

One of the prior art references that relates to the improvement of oxidation resistance of the Cu type electrode materials is Japanese Unexamined Patent Publication (Kokai) No. 7-230714. The technology described in this reference suppresses the oxidation of copper powder on the basis of the principle that, when a metallic boride is blended, boron is oxidized in preference to copper powder.

In contrast, the present invention that will be explained later does not prevent oxidation of the Cu electrode portion.

In order to obtain a laminate product between ceramic materials, particularly PZT type materials that will generically have a $Pb(Zr, Ti)O_3$ type perovskite structure while a boundary portion remains under a satisfactory condition, it is preferred to simultaneously bake the laminate of the PZT type material and the Cu electrode material. However, the PZT type material is preferably baked in the oxidizing atmosphere because it is an oxide whereas the Cu electrode material is preferably baked in the reducing atmosphere, for example, because the Cu electrode material needs a high conductivity.

Adjustment of the baking atmosphere that simultaneously satisfies the requirements for the PZT type material and the Cu electrode material is not impossible. Even when such an adjustment of the atmosphere is realized, however, the problem yet remains unsolved as to whether or not the atmosphere condition can sufficiently exploit performance of the laminate product. For example, when the atmosphere condition is such that the Cu electrode material can be sufficiently reduced, the PZT type material is presumably reduced to a certain extent, too. Needless to say, the performance of PZT drops if the PZT type material is reduced.

The condition that permits sufficient reduction of the Cu electrode material may well be the condition that permits also PZT to sufficiently exhibit its performance. If the drop of performance is restricted for the secondary factor that bonding can be sufficiently maintained, for example, a drop of in performance results from partial reduction.

In other words, according to the prior art technologies, reduction partially deteriorates the piezoelectric property, partial contraction (expansion) invites the occurrence of de-lamination and curving and a drastic drop in performance. In contrast, according to the present invention, the demerit is only the drop of performance by partial reduction.

Performance of PZT may be improved by gradually weakening the reducing condition during the process, though the Cu material is sufficiently reduced once, so as to mitigate the degree of reduction of PZT.

SUMMARY OF THE INVENTION

In view of the problems of the prior art described above, the present invention is directed to provide a laminate type dielectric device capable of sufficiently bonding an electrode material, such as Cu, to a ceramic material by using an economical base metal material such as Cu, and fully exploiting the characteristics of a dielectric ceramic layer, a production method thereof, and an electrode paste material.

According to a first aspect of the present invention, there is provided a laminate type dielectric device formed by alternately laminating dielectric ceramic layers and electrode layers, wherein the electrode layers are mainly made of an electrically conductive base metal material having greater standard Gibbs free energy of the formation of metal oxides at a baking temperature than that of ceramic materials constituting the dielectric ceramic layers, and segregation of materials inclusive of the electrically conductive base metal material does not occur at a portion sandwiched between adjacent positive and negative electrode layers in the dielectric ceramic layers.

The term "portion sandwiched between the adjacent positive and negative electrode layers in the dielectric ceramic layers" represents the region that is sandwiched between the overlapping portion when the positive electrode layer and the negative electrode layer are seen in the laminating direction. When the positive or negative electrode layer has a portion that does not operate as the electrode due to its discontinuity, a portion of the dielectric portion opposing the former portion does not correspond to the portion sandwiched between the electrode layers described below.

The term "segregation" of the material inclusive of the electrically conductive base metal material described above represents the condition in which the electrically conductive base metal having intensity of at least 60% is not detected inside the dielectric ceramic layers with respect to the intensity of the electrically conductive base metal in the electrode layers when component analysis is conducted for the electrode layers and the dielectric ceramic layers by EPMA, respectively. The substance detected in this case is not particularly limited to the metal (inclusive of the case where the substance is detected as the component element). The term "intensity" represents the detection intensity by an electronic probe micro-analyzer (EPMA), and the term "intensity of at least 60%" may correspond well to an intensity ratio under the following apparatus condition:

| | |
|---|---|
| acceleration voltage: | 20 kv |
| probe current: | $1 \times 10^7$ A |
| probe diameter: | 1 $\mu$m |
| Dwell (ms): | 20 ms |
| Interval ($\mu$m): | 0.58 $\mu$m × 0.58 $\mu$m (corresponding to 700X) |
| number of pixels: | 256 × 256 pixels (corresponding to 700X) |

Next, the function and effect of the present invention will be explained.

In the laminate type dielectric device according to the present invention, the electrode layers are made of an electrically conductive base metal material having a greater standard Gibbs free energy for forming a metal oxide at a baking temperature than that of the ceramic material, as its principal component.

It is noteworthy in the present invention that segregation of the material inclusive of the electrically conductive base material inside the dielectric ceramic layers, that becomes a problem when at least a part of the conductive base metal material is oxidized, or during a process in which a temperature becomes higher than a eutectic point of an oxide of the conductive base metal material and a part of the ceramic material such as when oxidation of the conductive base metal material temporarily occurs in a baking process, does not occur.

Consequently, even when the atmosphere at the time of baking that satisfies the conditions of both ceramic material and conductive base metal material is somewhat adjusted towards the oxidation side in comparison with the prior art condition to invite a temporary oxidizing atmosphere, segregation due to the oxidation of the electrode material does not occur, reduction of the ceramic material can be suppressed, and the drop of performance of the dielectric ceramic layers can be prevented. Segregation of the electrode material occurs inside the dielectric ceramic layers when the conventional electrode materials are used, and the occurrence of the drop of characteristics of the dielectric ceramic layers and its cracks become the problem because the electrode material does not have the original characteristics.

Those metals which can secure electric conductivity even when oxidized can be used as the electrically conductive base metal material constituting the electrode layers described above. In this way, performance of the electrode layers itself can be secured.

Therefore, the present invention can provide a laminate type dielectric device capable of sufficiently exploiting the characteristics of the dielectric ceramic layers by using an economical base metal material for the electrodes.

At least a part of the conductive base metal material may be oxidized according to a second aspect of the invention. In this case, the excellent function and effect described above can be acquired, too.

According to a third aspect of the invention, a bonding layer made of a material that keeps the dielectric characteristics of the dielectric ceramic layer is preferably interposed between one of the dielectric ceramic layers and one of the electrode layers. Here, the material for keeping the dielectric characteristics of the dielectric ceramic layer does not establish insulation between the electrode layer and the ceramic layer, though it does not have the properties equivalent to those of the dielectric ceramic layer. It is of importance that the material does not at all form an insulating layer, but a material that insulates electric conductivity may well be distributed as long as it does not prevent continuity of the electrode/bonding layer/ceramic layer.

According to a fourth aspect of the invention, the bonding layer described above is preferably constituted as the components constituting the dielectric ceramic layer are partially substituted by other atoms. When this condition is satisfied, the bonding layer can be readily formed.

Here, the term "substitution" represents the case where the material after substitution is classified as the same structure when the atomic arrangement is classified crystallographically.

According to a fifth aspect of the invention, the bonding layer is preferably constituted such that Ca is diffused into the dielectric ceramic layers. In this case, too, the effect of keeping the dielectric characteristics of the dielectric ceramic layers described above can be easily acquired.

According to a sixth aspect of the invention, the conductive base metal material is preferably any one of Cu, Ni, a mixture of Cu and Ni, and/or their alloys. These base metals are economical and have excellent conductivity. Further, their oxides have excellent conductivity. Therefore, these base metal materials can be used for the electrode layers. In any case, the metals satisfying the standard may be used as a mixture.

The mixture or alloy of Cu and Ni can be used because Cu and Ni have a complete solid solution system phase equilibrium.

Because of the complete solid solution system, both mixture and alloy are not melted at a lower temperature than both of Ni and Cu, and can be therefore used. However, limitation of the Ni and Cu composition is necessary.

According to a seventh aspect of the invention, at least one of the dielectric ceramic layers is preferably made of PZT as an oxide mainly having a $Pb(Zr, Ti)O_3$ perovskite structure. This PZT exhibits extremely excellent characteristics as a dielectric and is suitable for the dielectric layer.

According to an eighth aspect of the invention, when at least one of the dielectric ceramic layers is made of PZT, the conductive base metal material is preferably any one of Cu, a mixture of Cu and Ni and their alloys. The dielectric consisting of the $Pb(Zr, Ti)O_3$ as the principal component can be applied limitedly to the metals that are more difficult to oxidize than PbO that remains due to variance of the composition or is added for low temperature baking. At this time, Ni is not suitable because it is more oxidizable than Pb. When Ni is used as a mixture, a Ni oxide may partially be formed. However, the formation of the oxide is not remarkable due to the formation of the Ni—Cu alloy, and the reduction of PbO can be mitigated, too.

Next, a ninth aspect of the invention provides a method of producing a laminate type dielectric device formed by alternately laminating dielectric ceramic layers and electrode layers, comprising at least a first step of forming a green sheet by shaping a ceramic material into a sheet form; a second step of applying an electrode paste material to at least one of the surfaces of the green sheet; a third step of laminating the green sheets applied with the electrode paste material, and bonding them together; a fourth step of degreasing a laminate product so bonded; and a fifth step of integrally baking the materials in the electrode layer and the materials in the dielectric ceramic layer within the same process step; wherein a laminate product containing, in the electrode layer as its principal component, an electrically conductive base metal material having greater standard Gibbs free energy for the formation of a metal oxide at a baking temperature than that of the ceramic material, and further containing, at least in the electrode layer, a melting restrictive material for restricting melting of an oxide of the electrically conductive base metal material existing, or formed, in the fifth step, is prepared immediately before the fifth step.

Fusion to the ceramic layer may occur in the fifth step. Since the fifth step is directed to sintering of the ceramic material and the electrode material, the temperature becomes high. In this case, in order to prevent in advance a part of the ceramic material and an oxide of a part of the electrode material from melting due to the eutectic reaction, for example, the melting restrictive material may well be contained in advance in the electrode layer.

This effect can be naturally obtained when a part of the oxide of the electrode material is formed in this case before and during the fifth step.

Next, a tenth aspect of the invention provides a method of producing a laminate type dielectric device formed by alternately laminating dielectric ceramic layers and electrode layers, comprising at least a first step of forming a green sheet by shaping a ceramic material into a sheet form; a second step of applying an electrode paste material to at least one of the surfaces of the green sheet; a third step of laminating the green sheets applied with the electrode paste material, and bonding them together; a fourth step of degreasing a laminate product so bonded; and a fifth step of integrally baking the materials in the electrode layer and the materials in the dielectric ceramic layer within the same process step; wherein a laminate product containing, in the electrode layer as its principal component, an electrically conductive base metal material having a greater standard Gibbs free energy for the formation of a metal oxide at a baking temperature than that of the ceramic material, and further containing, at least in the electrode layer, either one of a melting point raising material for raising the melting point of an oxide of the electrically conductive base metal material formed in the fifth step or a compound between the oxide and the ceramic material and a melting point raising material for raising the melting point of the oxide of the electrically conductive base metal material and a material mixed in the ceramic material, is prepared immediately before the fifth step.

This production method, too, prevents melting of the electrode material in the fifth step in which the temperature becomes high, in the same way as in the ninth aspect of the invention. The difference of this invention from the ninth aspect of the invention resides in means for preventing melting in the baking step by raising the melting point of the material to be melted. Quite naturally, the materials to be melted are diversified such as in the case of the electrode material, the case of the eutectic material of the electrode material and the ceramic material, the case of the eutectic between the material added for a low temperature baking to the ceramic material and the electrode material, the case of the structural material of the laminate product, and so forth.

An eleventh aspect of the invention provides a method of producing a laminate type dielectric device formed by alternately laminating dielectric ceramic layers and electrode layers, comprising at least a first step of forming a green sheet by shaping a ceramic material into a sheet form; a second step of applying an electrode paste material to at least one of the surfaces of the green sheet; a third step of laminating the green sheets applied with the electrode paste material, and bonding them together; a fourth step of degreasing a laminate product so bonded; and a fifth step of integrally baking the materials in the electrode layer and the materials in the dielectric ceramic layer within the same process step; wherein a laminate product containing, in the electrode layer as its principal component, an electrically conductive base metal material having a greater standard Gibbs free energy for the formation of a metal oxide at a baking temperature than that of the ceramic material, and further containing, at least in the electrode layer, either one of a melting point raising material for raising the melting point of an oxide of the electrically conductive base metal material formed in the fifth step or a compound between the oxide and the ceramic material, and a melting point raising material for raising the melting point of the oxide of the electrically conductive base metal material and a material mixed in the ceramic material, and a diffusion restrictive material for restricting diffusion of the oxide of the electrically conductive base metal material into the green sheet as the component elements of the diffusion restrictive material diffuse by themselves into the green sheet in the fifth step, is prepared immediately before the fifth step.

This production method prevents melting of the electrode material by the melting point raising material and improves bonding between the ceramic layer and the electrode layer by the diffusion restrictive material without promoting diffusion of the electrode material, in the same way as the function and effect of the tenth aspect of the invention.

Next, a twelfth aspect of the invention provides a method of producing a laminate type dielectric device formed by alternately laminating dielectric ceramic layers and electrode layers, comprising the steps of: forming a green sheet by shaping a ceramic material into a sheet form; applying an electrode paste material to at least one of the surfaces of the green sheet, the electrode paste material containing as its principal component an oxide of an electrically conductive base metal material having a greater standard Gibbs free energy for the formation of a metal oxide at a baking temperature than that of the ceramic material, and further containing a melting restrictive material for restricting an oxide of the electrically conductive base metal material formed during integral baking from fusing to the green sheet; laminating the green sheets applied with the electrode paste material; and integrally baking the resulting laminate.

The production method of this invention uses a specific electrode paste material as described above. Therefore, it is possible to easily produce the laminate type dielectric device having the electrode layer that contains the electrically conductive base metal material. The resulting laminate type dielectric device can keep excellent characteristics because segregation and diffusion to the ceramic layer due to oxidation of the electrode material are suppressed.

Because the specific electrode paste material is used, expansion of the substance inside the electrode paste material can be suppressed even when large amounts of oxygen (such as air) are charged in the degreasing step before baking, and degreasing can be carried out without any problem.

A thirteenth aspect of the invention provides a method of producing a laminate type dielectric device formed by alternately laminating dielectric ceramic layers and electrode layers, comprising the steps of forming a green sheet by shaping a ceramic material into a sheet form; applying an electrode paste material to at least one of the surfaces of the green sheet, the electrode paste material containing as its principal component an oxide of an electrically conductive base metal material having a greater standard Gibbs free energy for the formation of a metal oxide at a baking temperature than that of the ceramic material, and further containing either one of a melting point raising material for raising the melting point of an oxide of said electrically conductive base metal material formed during integral baking or a compound between said oxide and said ceramic material, and a melting point raising material for raising the melting points of the oxide of the electrically conductive base metal material and materials mixed in the ceramic material; laminating the green sheets applied with the electrode paste material; and integrally baking the resulting laminate.

The production method of this invention, too, uses a specific electrode paste material as described above. Therefore, it is possible to easily produce the laminate type dielectric device having the electrode layer that contains the electrically conductive base metal material. The resulting laminate type dielectric device can keep excellent characteristics because segregation and diffusion to the ceramic layer due to oxidation of the electrode material are suppressed.

Because the specific electrode paste material is used, expansion of the substance inside the electrode paste material can be suppressed even when a large amount of oxygen (such as air) is charged in the degreasing step before baking, and degreasing can be carried out without any problem.

A fourteenth aspect of the invention provides a method of producing a laminate type dielectric device formed by alternately laminating dielectric ceramic layers and electrode layers, comprising the steps of: forming a green sheet by shaping a ceramic material into a sheet form; applying an electrode paste material to at least one of the surfaces of the green sheet, the electrode paste material containing as its principal component an oxide of an electrically conductive base metal material having a greater standard Gibbs free energy for the formation of a metal oxide at a baking temperature than that of the ceramic material, and further containing at least a melting point raising material for raising the melting point of an oxide of the electrically conductive base metal material formed during integral baking or the melting point of a compound between the oxide and the ceramic material, or the melting point of the oxide of the electrically conductive base metal material and materials mixed in the ceramic material, and a diffusion restrictive material for restricting diffusion of the oxide of the electrically conductive base metal material into the green sheet as the component elements of the diffusion restrictive material diffuse by themselves into the green sheet during integral baking; laminating the green sheets applied with the electrode paste material; and integrally baking the resulting laminate.

The production method of this invention, too, uses a specific electrode paste material as described above. Therefore, it is possible to easily produce the laminate type dielectric device having the electrode layer that contains the electrically conductive base metal material. The resulting laminate type dielectric device can keep excellent characteristics because segregation and diffusion to the ceramic layer due to oxidation of the electrode material are suppressed.

Because the specific electrode paste material is used, expansion of the substance inside the electrode paste material can be suppressed even when large amount of oxygen (such as air) is charged in the degreasing step before baking, and degreasing can be carried out without any problem.

In this production method of the laminate type dielectric device, too, the electrically conductive base metal material is preferably any one of Cu, Ni, a mixture of Cu and Ni and their alloy in the same way as in a fifteenth aspect of the invention.

The dielectric ceramic layer preferably comprises PZT as an oxide mainly having a $Pb(Zr, Ti)O_3$ type perovskite structure in the same way as in a sixteenth aspect of the invention. As described already, this PZT exhibits extremely excellent characteristics as a dielectric and is suitable for the dielectric ceramic layer.

The electrically conductive base metal material is preferably Cu, a mixture of Cu and Ni or their alloy according to a seventeenth aspect of the invention.

In such a case, the laminate type dielectric device can be easily produced at a lower cost of production.

The melting restrictive material is preferably a Ca compound in the same way as in an eighteenth aspect of the invention.

The Ca compound is preferably $CaCO_3$ or CaO in the same way as in a nineteenth aspect of the invention. When $CaCO_3$ is employed, CaO is formed during integral baking, and can reliably prevent or restrict melting of the mixture of the ceramic material and the electrically conductive base metal material.

According to a twentieth aspect of the invention, when the amount of the electrode layer exclusive of the $CaCO_3$ or CaO is 100 wt %, $CaCO_3$ or CaO is preferably contained within a range of 1 wt % to 15 wt % calculated as CaO.

When the amount is not more than 1 wt %, the segregation restriction effect of the component element Cu is not sufficient, and when it exceeds 15 wt %, on the other hand, the specific resistance increases by one order of magnitude and deterioration of conductivity is observed.

According to a twenty-first aspect of the invention, the melting point raising material is preferably a material which exhibits a change of a melting point of a complete solid solution system when it is reacted with a reaction material between the ceramic material and an oxide of the electrically conductive material, or with a reaction material between the oxide of the electrically conductive base metal material and a material mixed in the ceramic material or with a reaction material made of an oxide of the electrically conductive base metal material, and has a higher melting point than that of the reaction materials, or a material which exhibits a change of a eutectic type melting point when it is reacted with any one of the reaction materials, in which the eutectic point with the reaction material exists within a range of an amount exceeding 0 wt % to 5 wt % calculated as the amount of the oxide of the component element of the reaction material, and which has a higher melting point than that of the reaction material.

The term "change of melting point of complete solid solution system" means that a melting point (reaction temperature) of a mixture (alloy) exists within the temperature zone interposed by the melting points (reaction temperatures) of two individual substances (Ni and Cu in FIG. 31, for example). Quite naturally, it is necessary at this time to add a material having a higher melting point so as to raise the melting point. In the case described above, the material must have a higher melting point than that of the reaction inducing material as any one of the compound or mixture of the ceramic material and the oxide of the electrically conductive base metal material, the oxide of the conductive base metal material and the substance mixed in the ceramic material and the oxide of the conductive base metal material. Incidentally, the term "mixture" may include those which can either partially or wholly create melting by the eutectic reaction, etc, and need not necessarily be limited to the materials that are merely mixed.

The change of the melting point of the complete solid solution system need not necessarily occur in the whole composition zone (0 to 100%) but may well occur in the region of a necessary addition amount.

Next, the content of the materials which exhibit the change of the eutectic point and whose eutectic point exists within the range of 0 to 5 wt % when calculated as the oxide of the constituent element, and their function and effect, will be explained.

Such a material has a phase equilibrium diagram shown in FIG. 32, for example. The drawing represents a phase equilibrium diagram of Ag and Bi by way of example. However, this is merely illustrative and has nothing to do at all with the actual additives and the reaction materials.

Ag and Bi have the eutectic point at Ag 2.5% and Bi 97.5%. As represented by the phase equilibrium diagram of FIG. 32, the eutectic material is ideally formed with the Ag amount within a broad range of 0.3 to 98%. In the case of powder, however, there is the region in which the formation of the eutectic material is retarded due to the specific surface area, the degree of mixing, non-uniformity, etc, that is, the composition range in which the melting temperature shifts toward a higher temperature side. This composition range is one that is far from the eutectic point.

When the eutectic point deviates either to the left or to the right in the phase equilibrium diagram, that is, when the eutectic point exists in a range where the amount of one of the material is small, the temperature at which eutectic occurs does not have a great difference from the melting point (reaction temperature) of the material of the greater amount.

For the two reasons described above, even when a material generating the phase equilibrium of the eutectic system is added, it becomes the melting point raising material in a region somewhat deviated from the eutectic point if the eutectic point exists in the region of the material having a smaller amount, and the composition zone at this time is a suitable amount as the addition amount to the electrode material. Here, the term "suitable amount for the electrode material" means the amount that can suppress the drop of conductivity of the electrode.

To raise the melting point, the melting point of the material described above must be higher than that of the reaction material.

According to a twenty-second aspect of the invention, the melting point raising material is preferably a material that exhibits a change of a melting point of a complete solid solution system when it is reacted with a reaction material comprising a mixture of the ceramic material and an oxide of the electrically conductive material at a temperature not higher than 680° C., or with a reaction material as a mixture of the oxide of the of the electrically conductive base metal material and a material mixed in the ceramic material or with a reaction material made of an oxide of the electrically conductive base metal material, and that has a higher melting point than that of the reaction materials, or a material which exhibits a change of an eutectic type melting point when it is reacted with any one of the reaction materials, in which the eutectic point with the reaction material exists within a range of an amount exceeding 0 wt % to 5 wt % calculated as the amount of the oxide of the component element of the reaction material, and which changes to, or generates, any of materials having a higher melting point than that of the reaction materials.

In this case, it is sufficient if the construction of the twenty-first aspect of invention can be achieved at 680° C. or below.

The eutectic phenomenon between PbO and $Cu_2O$, that might be one of the factors of melting of the electrode material, occurs at 680° C. If oxidation of the electrode material is not complete, Cu and $Cu_2O$ generate the eutectic reaction. Therefore, since the eutectic reaction may occur at 680° C. or below, melting can be suppressed if the melting point raising material is formed before the eutectic reaction takes place. The material (material in the starting materials) need not be limited to the inorganic materials.

The melting point raising material is preferably a Mg compound or a Sr compound according to a twenty-third aspect of the invention.

The Mg compound is preferably MgO and the Sr compound is preferably $SrCO_3$ according to a twenty-fourth aspect of the invention. When MgO or $SrCO_3$ is employed, it can reliably raise the melting point of at least one kind of the compound or mixture of the ceramic material and the electrically conductive base metal material, the mixture of the oxide of the conductive base metal material and the materials mixed in the ceramic material, and the oxide of the conductive base metal material. The additives are not particularly limited to those described above so long as they fall in the range of this concept.

In all the cases described above, the Ca compound, the Mg compound and Sr compound may be oxides or carbonates. The oxide need not be limited to CaO, and materials outside the range of Ca:O=1:1 may be used if such exist. This also holds true of the Mg oxide and the Sr oxide.

The following steps (1) to (3) are available, for example, when the laminate product is produced from the paste material:

(1) evaporation of solvent and binder in air
(2) metallizing of electrode portion
(3) baking of ceramic portion The reason why CuO, for example, is used as the principal component in the present invention is because the production process includes (1) evaporation of a solvent and a binder in air. CuO changes to Cu or $Cu_2O$ during the steps (2) and (3). In the paste material containing Cu, Cu changes (ix oxidized) to CuO or $Cu_2O$ in the step (1), and expansion resulting from oxidation in turn results in the occurrence of de-lamination. Therefore, the Cu paste material may well be degreased in a $N_2$ atmosphere, for example, and is then baked.

However, degreasing can also be conducted in air when Cu is mixed besides CuO, such as when Cu+CuO is used as the principal component. Therefore, the principal components need not be limited to CuO alone.

According to a twenty-fifth aspect of the invention, when the amount of the electrode layer exclusive of the MgO or the electrode layer exclusive of MgO and the diffusion restrictive material is 100 wt %, MgO is contained preferably in an amount within the range of 0.2 to 20 wt %. When the amount is less than 0.2 wt %, diffusion of the component element Cu occurs, and segregation possibly occurs, too. When it exceeds 20 wt %, on the other hand, the specific resistance drastically increases, and the problem occurs in conductivity of the electrode.

According to a twenty-sixth aspect of the invention, when the amount of the electrode layer exclusive of $SrCO_3$ or the electrode layer exclusive of $SrCO_3$ and the diffusion restrictive material is 100 wt %, $SrCO_3$ is contained preferably in an amount within the range of 10 to 15 wt % calculated as SrO. The melting point raising effect cannot be expected when the content is less than 10 wt %.

According to a twenty-seventh aspect of the invention, the diffusion restrictive material is preferably a Ca compound.

According to a twenty-eighth aspect of the invention, the Ca compound described above is particularly preferably $CaCO_3$ or CaO. while this CaO restricts melting, diffusion and segregation of the mixture of the ceramic material and the electrically conductive base metal material, the constituent element Ca diffuses into the dielectric ceramic layer, so that the bonding strength between the electrode layer and the dielectric ceramic layer can be improved.

According to a twenty-ninth aspect of the invention, when the amount of the electrode layer exclusive of $CaCO_3$ or CaO and the melting point raising material is 100 wt %, $CaCO_3$ or CaO is contained preferably within a range of an amount exceeding 1 wt % to 15 wt % calculated as CaO. When the amount is not more than 1 wt %, the segregation restrictive effect of the component element Cu is not sufficient and when it exceeds 15 wt %, on the other hand, the specific resistance increases by one digit and deterioration of conductivity is observed.

Particularly when the diffusion restrictive material is the Ca compound, further preferably $CaCO_3$ or CaO and the melting point raising material is the Mg compound or the Sr compound, further preferably MgO or $SrCO_3$, segregation and diffusion of the conductive base metal material can be suppressed, and the bonding strength can be improved.

According to a thirtieth aspect of the invention, it is preferred that a designated electrode paste material is applied to both surface of the green sheets, and the green sheets applied with the electrode paste material are laminated while sandwiching electrically conductive powder or thin film, and are then integrally baked.

As described above, when the green sheets are laminated while interposing powder or the thin film having conductivity and are integrally baked, the electrode layer can more reliably secure electric conductivity. For example, portions having low conductivity have been formed in the past due to non-uniformity of the paste material printed, but this invention can acquire the laminate type dielectric device having high conductivity as a whole.

Next, a thirty-first aspect of the invention provides a laminate type dielectric device formed by alternately laminating dielectric ceramic layers and electrode layers, wherein the electrode layers are made of an electrically conductive base metal material having a greater standard Gibbs free energy for the formation of a metal oxide at a baking temperature than that of a ceramic material constituting mainly the dielectric ceramic layers, and wherein, when a reference straight line orthogonally crossing any one of the dielectric ceramic layers and two electrode layers above and below the dielectric ceramic layer is assumed, a portion containing a Ca amount per unit volume greater than A+B, where A is a Ca amount per unit volume contained at a center point at the center of the dielectric ceramic layer between the two electrode layers in a thickness-wise direction and B is a Ca amount per unit volume contained in either the above or below one of the electrode layers, exists on the reference straight line connecting the electrode layer containing B to the center point.

In the present invention, the constituent element Ca exists concentratedly at the boundary portion between one of the electrode layers and one of the dielectric ceramic layers. The existence of the component element Ca restricts diffusion and segregation of the electrode material into the dielectric ceramic layer, or improves the bonding strength between the electrode layer and the dielectric ceramic layer.

Due to restriction of diffusion and segregation of the electrode material into the dielectric ceramic layers, it is possible to obtain dielectric ceramic layers having excellent performance.

It should be particularly noted hereby that the present invention can be distinguished from the case where the component element Ca is in advance contained in the dielectric ceramic layers, from the distribution of the component element Ca in the product.

The effect described above cannot be obtained when the material to which the component element Ca is added in advance to the dielectric ceramic layers, such as (Pb, Ca) (Zr, Ti)$O_3$ is used, and Ca is uniformly distributed in this case.

Next, a thirty-second aspect of the invention provides a laminate type dielectric device formed by alternately laminating dielectric ceramic layers and electrode layers, wherein the electrode layers are made of an electrically conductive base metal material having a greater standard Gibbs free energy for the formation of a metal oxide at a baking temperature than that of a ceramic material constituting mainly the dielectric ceramic layers, and at least one of the electrode layers contains Mg as a component element.

In this invention, the component element Mg exists inside the electrode layer, suppresses diffusion and segregation of the electrode material and provides excellent characteristics. At this time, the component element Mg need not exist in all of the electrode layers.

First, even when MgO in such a small amount that cannot be detected by means of EPMA is added to the electrode paste, the existence of such a small amount of Mg exhibits the effect of suppressing diffusion and segregation of the electrode material into the dielectric layers.

Second, the existence of the component element Mg provides a great effect of suppressing diffusion and segregation of the electrode material into the dielectric ceramic layers, and there is the possibility that sufficient performance can be obtained even when diffusion restriction is not promoted in all the electrode layers. For example, even when the suppression effect of diffusion and segregation is not promoted in one electrode layer among ten electrode layers, more excellent overall performance can be obtained than in the prior art devices because the other electrode layers restrict diffusion and segregation.

For the two reasons described above, the component element Mg may be contained in such an amount that it can be detected in only a limited part of an arbitrary electrode layer.

The two reasons described above can be applied not only to the component element Mg but also to other constituent elements added to restrict diffusion and segregation.

Next, a thirty-third aspect of the invention provides a laminate type dielectric device formed by alternately laminating dielectric ceramic layers and electrode layers, wherein the electrode layers are made of an electrically conductive base metal material having a greater standard Gibbs free energy for the formation of a metal oxide at a baking temperature than that of a ceramic material constituting mainly the dielectric ceramic layers, and wherein the Mg content per unit volume in the electrode layers is greater than a mean value of the Mg content per unit volume in said dielectric ceramic layers.

This invention is basically the same as the thirty-second aspect of the invention described above, but sets the reference for judging the existence/absence of detection from an error (error in X-ray intensity, for example, in a measuring apparatus (EPMA, for example) of the component elements. However, the thirty-third aspect of the invention is not applied when the ceramic material apparently contains Mg.

Next, a thirty-fourth aspect of the invention provides a laminate type dielectric device formed by alternately laminating dielectric ceramic layers and electrode layers, wherein the electrode layers are made of an electrically conductive base metal material having a greater standard Gibbs free energy for the formation of a metal oxide at a baking temperature than that of a ceramic material constituting mainly the dielectric ceramic layers, and wherein the Sr content per unit volume in the electrode layers is greater than a mean value of the Sr content per unit volume in the dielectric ceramic layers.

When the addition amount of the component element Sr in the electrode layer is small, the intended effect cannot be obtained. Therefore, less than 10 wt % of Sr is contained in the ceramic material. The component element Sr suppresses diffusion and segregation of the electrode material and provides excellent characteristics.

For the same reason as described above, the electrically conductive base metal material is preferably any one of Cu, Ni' a mixture of Cu and Ni and their alloys according to a thirty-fifth aspect of the invention.

According to a thirty-sixth aspect of the invention, the dielectric ceramic layers described above preferably comprise PZT as an oxide mainly having a Pb(Zr, Ti)O$_3$ type perovskite structure.

For the same reason as described above, the electrically conductive base metal material is preferably any one of Cu, Ni, a mixture of Cu and Ni and their alloys according to a thirty-seventh aspect of the invention.

Next, a thirty-eighth aspect of the invention provides an electrode paste material for forming electrode layers in a laminate type dielectric device formed by alternately laminating dielectric ceramic layers and the electrode layers, wherein the electrode paste material comprises CuO as its principal component, and contains a melting restrictive material for restricting melting of a copper oxide to the dielectric ceramic layers during integral baking.

When the electrode paste material according to the present invention is used, expansion due to oxidation can be suppressed during the degreasing step for oxidizing carbon, and a laminate type dielectric device having the Cu-containing electrode layers can be easily produced. The laminate type dielectric device so produced can have excellent characteristics.

In other words, when a laminate product interposing a CuO paste material, not containing an additive, between ceramic materials is integrally baked, oxidation of Cu is observed when the laminate product is produced by increasing an oxygen partial pressure rather than under a reducing condition for restricting reduction of the ceramic material and reducing the Cu electrode material. Since the PZT type material is an oxide, the melting phenomenon due to the eutectic reaction, for example, occurs between the oxides.

When this melting occurs in large quantities at a low temperature, the melted material flows into the ceramic material because baking of the ceramic material has not proceeded. When the dielectric ceramic layer after baking is split and is inspected, the Cu-containing compound is found segregated but not diffused. The segregated material does not always have piezoelectric characteristics like the ceramic material, but not only deteriorates the piezoelectric characteristics but also results in the occurrence of cracking during driving. When the melting temperature is high or the melting amount is small, sintering of the ceramic proceeds with the result that diffusion occurs without reaching segregation. The diffusion material does not always have the piezoelectric characteristics, and the problem occurs in the same way as in the case of segregation.

In the electrode paste material comprising CuO paste material to which the specific material is added, segregation and diffusion of the Cu-containing compound can be suppressed in the ceramic material because melting is restricted.

Next, a thirty-ninth aspect of the invention provides an electrode paste material for forming electrode layers in a laminate type dielectric device formed by alternately laminating dielectric ceramic layers and the electrode layers, wherein the electrode paste material comprises CuO as its principal component, and contains a melting point raising material for raising a melting point (e.g. eutectic point) of the copper oxide or a melting point of a compound between the copper oxide and ceramic material constituting said dielectric ceramic layers, or melting points of materials mixed in the ceramic material and the copper oxide during integral baking.

When the electrode paste material according to the present invention is used, segregation and diffusion of the Cu-containing compound can be suppressed due to restriction of melting resulting from the rise of the melting point.

Next, a fortieth aspect of the invention provides an electrode paste material for forming electrode layers in a laminate type dielectric device formed by alternately laminating dielectric ceramic layers and the electrode layers, wherein the electrode paste material comprises CuO as its principal component, and contains a melting point raising material for raising a melting point of the copper oxide or a melting point of a compound between the copper oxide and ceramic material constituting the dielectric ceramic layers, or melting points of materials mixed in the ceramic material and the copper oxide during integral baking, and a diffusion restrictive material for restricting diffusion of the copper oxide into the dielectric ceramic layers during integral baking, the components of the diffusion restrictive material diffusing by themselves into the dielectric ceramic layers during integral baking.

When the electrode paste material according to the present invention is used, segregation and diffusion of the Cu-containing compound can be suppressed due to the rise of the melting point and restriction of diffusion, and the bonding strength between the electrode layers and the dielectric ceramic layers can be improved.

According to a forty-first aspect of the invention, the at least one of the dielectric ceramic layers described above preferably consists of PZT as an oxide mainly having a Pb(Zr, Ti)O$_3$ type perovskite structure.

In the electrode paste material described above, the melting restrictive material is preferably a Ca compound according to a forty-second aspect of the invention.

For the same reason as described above, the Ca compound is preferably CaCO$_3$ or CaO according to a forty-third aspect of the invention.

For the same reason as described above, when the amount of the electrode layers exclusive of CaCO$_3$ or CaO is 100 wt %, it is preferred that CaCO$_3$ or CaO is contained within a range of an amount exceeding 1 wt % to 15 wt % calculated as CaO according to a forty-fourth aspect of the invention.

In the electrode paste material described above, too, it is preferred that the melting point raising material is either a material that exhibits a change of a melting point of a complete solid solution system when it is reacted with a reaction material between the ceramic material and a copper oxide, or with a reaction material between the copper oxide and a reaction material made of the copper oxide, and has a higher melting point than that of the reaction materials, or a material which exhibits a change of a eutectic type melting point when it is reacted with any one of the reaction materials, in which the eutectic point with the reaction material exists within a range of an amount exceeding 0 wt % to 5 wt % calculated as the amount of the oxide of the component element of the reaction material, and which has a higher melting point than that of the reaction material, according to a forty-fifth aspect of the invention.

According to a forty-sixth aspect of the invention, the melting point raising material is either a material which exhibits a change of a melting point of a complete solid solution system when it is reacted with a reaction material comprising a mixture of the ceramic material and a copper oxide at a temperature lower than 680° C., or with a reaction material comprising a mixture of the copper oxide and a material mixed in the ceramic material, or with a reaction material comprising the copper oxide, and has a higher melting point than that of the reaction materials, or a material which exhibits a change of an eutectic type melting point when it is reacted with any one of the reaction materials, in which the eutectic point with said reaction materials exists within a range of an amount exceeding 0 wt % to 5 wt % calculated as the amount of the copper oxide, and which changes to, or generates, a material having a higher melting point than that of the reaction materials.

According to a forty-seventh aspect of the invention, the melting point raising material in the electrode paste material described above is preferably a Mg compound or a Sr compound.

According to a forty-eighth aspect of the invention, in particular, the Mg compound described above is preferably MgO and the Sr compound is preferably SrCO$_3$.

According to a forty-ninth aspect of the invention, when the amount of the electrode paste material exclusive of MgO or the electrode paste material exclusive of MgO and the diffusion restrictive material is 100 wt %, MgO is preferably contained in an amount within the range of 0.2 wt % to 20 wt % calculated as CaO.

According to a fiftieth aspect of the invention, when the amount of the electrode paste material exclusive of SrCO$_3$ or the electrode paste material exclusive of SrCO$_3$ and the diffusion restrictive material is 100 wt %, SrCO$_3$ is preferably contained in an amount within the range of 10 wt % to 15 wt % calculated as SrO.

According to a fifty-first aspect of the invention, the diffusion restrictive material in the electrode paste material is preferably a Ca compound.

For the same reason as described above and according to a fifty-second aspect of the invention, the Ca compound is particularly preferably CaCO$_3$ or CaO.

According to a fifty-third aspect of the invention, when the amount of the electrode paste material exclusive of CaCO$_3$ or CaO and the melting point raising material is 100 wt %, CaCO$_3$ or CaO is preferably contained within a range of an amount exceeding 1 wt % to 15 wt % calculated as CaO for the same reason as described above.

According to fifty-fourth and fifty-eighth aspects of the invention, the electrode paste material preferably contains a cooperative material comprising at least one kind of the principal components constituting the dielectric ceramic layers. In this case, the bonding condition between the resulting electrode layers and the dielectric ceramic layers can be improved.

According to fifty-fifth and fifty-ninth aspects of the invention, the electrode paste material further preferably contains a cooperative material made of substantially the same material that constitutes the dielectric ceramic layers. In this case, the bonding condition between the resulting electrode layers and the dielectric ceramic layers can be further improved.

According to fifty-sixth and sixtieth aspects of the invention, the amount of the cooperative material is preferably less than 25 wt %. When the amount exceeds 25 wt %, the electrode becomes discontinuous, and upper and lower ceramic layers adhere to each other. As a result, conductivity drops and the drop of performance occur. Therefore, the amount of the cooperative material is more preferably 15 wt % or below according to fifty-seventh and sixty-first aspects of the inventions.

A greater standard Gibbs free energy for the formation of a metal oxide of the material means that the material is "more difficultly oxidizable". For example, Gibbs free energy for the formation of a Cu oxide at 1,000° C. is about −40. It is bout −15 for a Pb oxide and about −60 for a Ni oxide. Therefore, Cu, Pb and Ni are less oxidizable in this order (see FIG. 36).

As shown in FIG. 31, Cu and Ni assume the complete solid solution system phase equilibrium. Therefore, a great change of the crystalline system does not occur, and the property changes linearly in accordance with the change of the composition. Therefore, linear calculation is conducted in accordance with the Gibbs free energy composition, and the mixture or alloy is employed within the range in which it is not smaller than Gibbs free energy for oxidizing Pb.

In the case of a mixture or alloy of [90%Cu+10%Ni], for example, the calculation result becomes (−40)×0.9+(−60)×01=−42. Since this value is greater than the Gibbs free energy (−45) for oxidizing Pb, the mixture or alloy can be used.

Whether or not the composition typified above can be used is decided from the read value of the calculation at 1,000° C. Therefore, this is a method of limiting the composition when the baking temperature is mainly 1,000° C. When the baking temperature is different from the example given above, the read numeric value is changed to the value at the baking temperature (see FIG. 36), and the calculation is similarly conducted. In this way, the usable composition can be selected.

In the case of non-Pb ceramic material, the element that is least oxidizable is used in place of Pb in the starting material to limit the Cu—Ni composition. In the case of the ceramic material using only those materials which are more easily oxidizable than Ni as the starting material, limitation of the Cu—Ni does not exist, and Ni can be applied, too.

DESCRIPTION OF THE PREFERRED EMBODIMENTS

Figure 1:
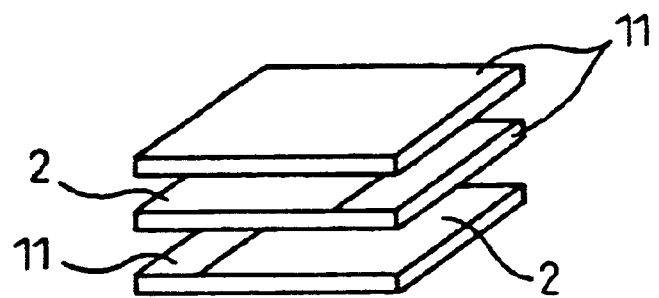
FIG. 1 is an explanatory view showing a production process of a laminate type dielectric device according to Embodiment 1.

Embodiment 1:

A laminate type dielectric device, its production method and an electrode paste material according to Embodiment 1 will be explained with reference to FIGS. 1 to 11.

In this embodiment, six kinds of Examples E1 to E6 as the products of the present invention and three kinds of Comparative Examples C1 to C3 as Comparative Examples were prepared as the electrode paste materials as tabulated in Table 1.

TABLE 1

| Sample No. | organic vehicle and resin | CuO powder | subtotal | additives (wt %) |
|---|---|---|---|---|
| Example E1 | 35.0 | 65.0 | 100.0 | CaO:5 |
| Example E2 | 35.0 | 65.0 | 100.0 | CaO:10 |

TABLE 1-continued

| Sample No. | organic vehicle and resin | CuO powder | subtotal | (wt %) additives |
|---|---|---|---|---|
| Example E3 | 35.0 | 65.0 | 100.0 | CaO:15 |
| Example E4 | 35.0 | 65.0 | 100.0 | MgO:5 |
| Example E5 | 35.0 | 65.0 | 100.0 | MgO:10 |
| Example E6 | 35.0 | 65.0 | 100.0 | SrO:10 |
| Comparative Example C1 | 35.0 | 65.0 | 100.0 | none |
| Comparative Example C2 | 35.0 | 65.0 | 100.0 | BaO:5 |
| Comparative Example C3 | 35.0 | 65.0 | 100.0 | Ti:5 |

The electrode paste materials of Examples E1 to E6 all contain CuO as the principal component, and at least one of a mixture of a ceramic material constituting a dielectric ceramic layer and CuO, a melting restrictive material for preventing or restricting melting of CuO and a melting point raising material for raising the melting point of the mixture.

In other words, the electrode paste materials of Examples E1 to E3 contain $CaCO_3$ that turns into CaO as the melting restrictive material. The electrode paste materials of Example E4 and E5 contain MgO as the melting point raising material. The electrode paste material of Example E6 contains $SrCO_3$ that turns into SrO as the melting point raising material.

The melting restrictive material and the melting point raising material are not added in Comparative Examples C1 to C3, but other additives are added in C2 and C3.

More concretely, Cu powder (mean particle diameter: 0.5 to 2 μm) and additives (CaO, MgO, SrO, etc) were blended and kneaded at blend ratios tabulated in Table 1 with an organic vehicle prepared by dissolving ethyl cellulose in terpineol and a resin agent (acrylic resin, arakyd resin, docell resin, etc) to prepare the paste materials. However, $CaCO_3$ and $SrCO_3$ were used to obtain respectively CaO and SrO in proportions calculated from the respective chemical formulas (hereinafter the same is for CaO and SrO).

A laminate type dielectric device was produced in the following way by using each of these electrode paste materials. In this embodiment, however, the number of lamination of the dielectric ceramic layers was 3 so that the section of the laminate type dielectric device could be easily observed.

First, a green sheet obtained by shaping the ceramic material into a sheet was produced by a doctor blade method.

Powder of lead oxide, zirconium oxide, titanium oxide, niobium oxide, strontium carbonate, etc, as the main starting materials of the dielectric ceramic layer was weighed so as to attain a desired composition. The lead content was weighed to be about 1 to 2% richer than the stoichiometric ratio of the mixture composition in consideration of evaporation of lead. The mixture was dry mixed by using a mixer and was then calcined at 800 to 900° C.

Pure water and a dispersant were added to the powder so calcined so as to form slurry. The resulting slurry was wet pulverized by using a pearl mill. After the pulverizate was dried and degreased, a solvent, a binder, a plasticiser, a dispersant, etc, were added and mixed by using a ball mill. The resulting slurry was vacuum de-foamed and its viscosity was adjusted while the slurry was being stirred by using a stirrer inside a vacuum apparatus.

Next, the slurry was shaped into a green sheet having a predetermined thickness by using a doctor blade.

After recovery, the green sheet was punched by using a puncher or is cut by using a cutter to give rectangular members having a predetermined size.

Next, the electrode paste material 2 of each of Examples E1 to E6 and Comparative Examples C1 to C3 was screen-printed into a pattern to one of the surfaces of two green sheets after shaping. In this embodiment, the printing thickness was 15 μm. The drawing shows an example of the green sheet after printing of the pattern.

Another green sheet 11, to which the electrode paste material was not printed, is added, and these three green sheets 11 are laminated as shown in the drawing in such a fashion that the electrode paste materials 2 alternately reach the right and left side surfaces.

After bonded, the laminate product was cut into a predetermined size.

Next, the laminate product was left standing in open air at 500° C. for 7 hours for degreasing, and was then subjected to a metallizing process.

The metallizing process is the process that reduces CuO in the electrode paste material to Cu in a reducing atmosphere at a relatively low temperature. In this embodiment, since the ceramic material was the oxide containing lead at least from the aspect of the chemical formula, the reducing atmosphere was adjusted to a temperature immediately below 326° C. as the eutectic point of lead and copper, and reduction was carried out.

A baking process for integrally baking the laminate product was then carried out. The baking temperature can be changed depending on the kind of the ceramic materials constituting the dielectric ceramic layer, and is set to 950° C. in this embodiment. This adjustment atmosphere is set to the atmosphere in which oxidation of Cu is less and the oxide of the device portion is not reduced as much as possible. The reducing power was smaller than that of the metallizing process, and the oxygen partial pressure varies depending on the baking temperature. In this embodiment, the oxygen partial pressure was about $10^{-4}$ atm at 950° C.

A side electrode and an outer electrode are fitted, depending on the kind of the product.

Figure 2:
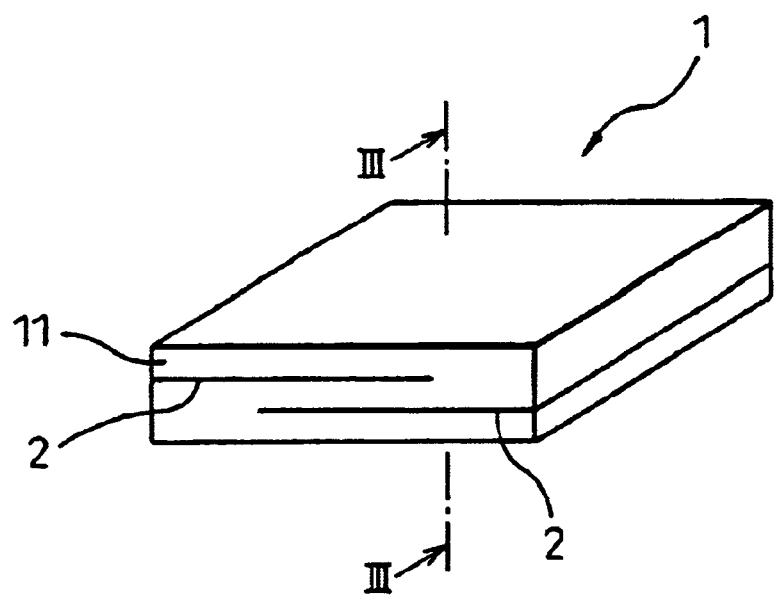
FIG. 2 is a perspective view showing the laminate type dielectric device in Embodiment 1.
Figure 3:
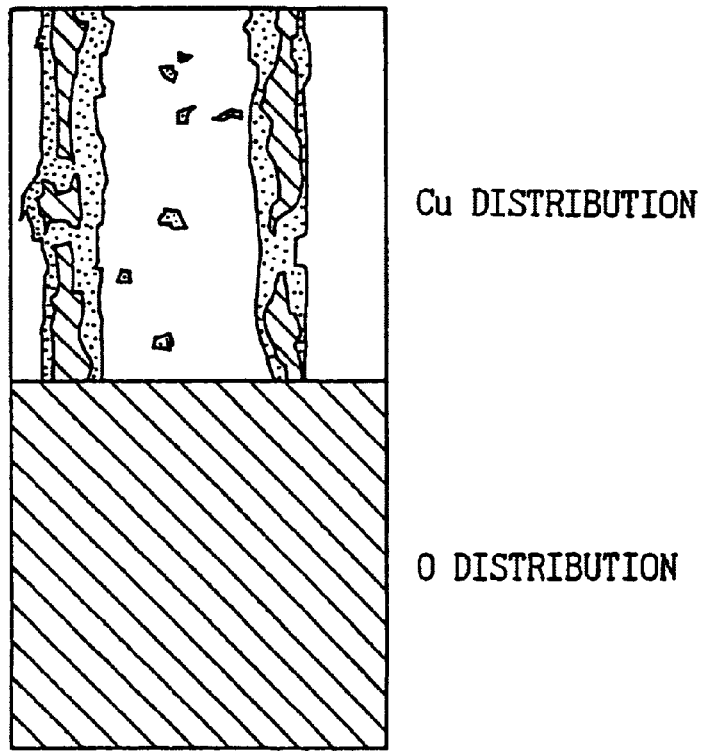
FIG. 3 is an explanatory view showing Cu and O distribution of a section of Example E1 in Embodiment 1.
Figure 4:
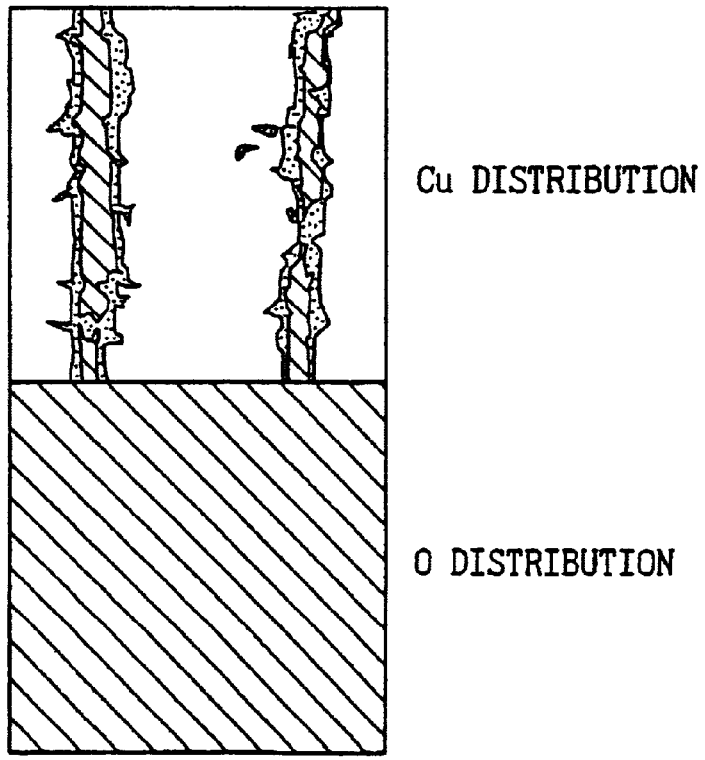
FIG. 4 is an explanatory view showing Cu and O distribution of a section of Example E2 in Embodiment 1.
Figure 5:
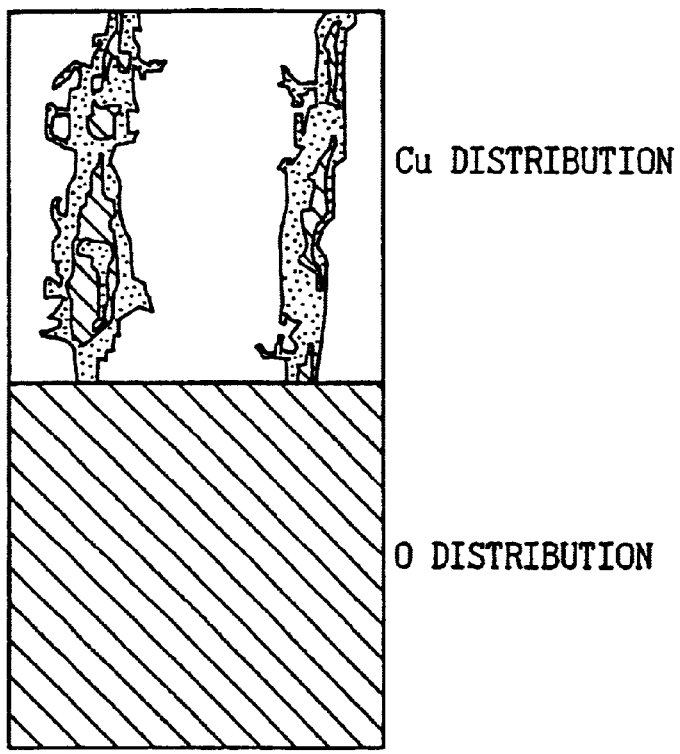
FIG. 5 is an explanatory view showing Cu and O distribution of a section of Example E3 in Embodiment 1.

The section of the laminate product (laminate type dielectric device 1) integrally baked as shown in FIG. 2 was observed in this embodiment. The observation position exists at the center of the section taken along a line III—III in FIG. 2.

The distribution of Cu and O in the section was observed and measured by using EPMA at an acceleration voltage of 20 kV, a current of $1 \times 10^{-7}$ A, number of pixels of 256×256, 20 ms per pixel and magnification of 700×.

FIGS. 3 to 11 represent schematic sketches of the observation results. In the drawings, hatching is applied to portions having relatively high concentrations.

The upper part of each drawing represents the distribution of the component element Cu and the lower part represents the distribution of the component element O at the same position.

Figure 8:
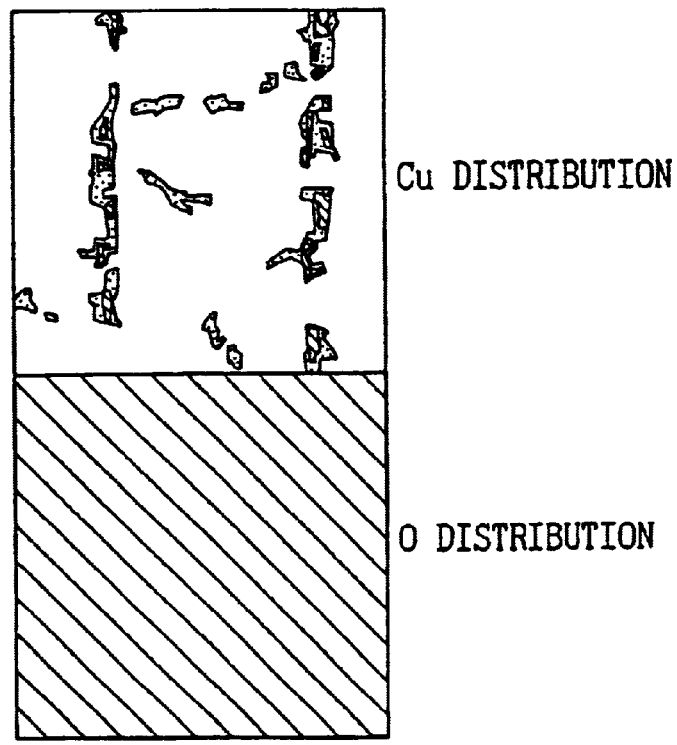
FIG. 8 is an explanatory view showing Cu and O distribution of a section of Example E6 in Embodiment 1.
Figure 9:
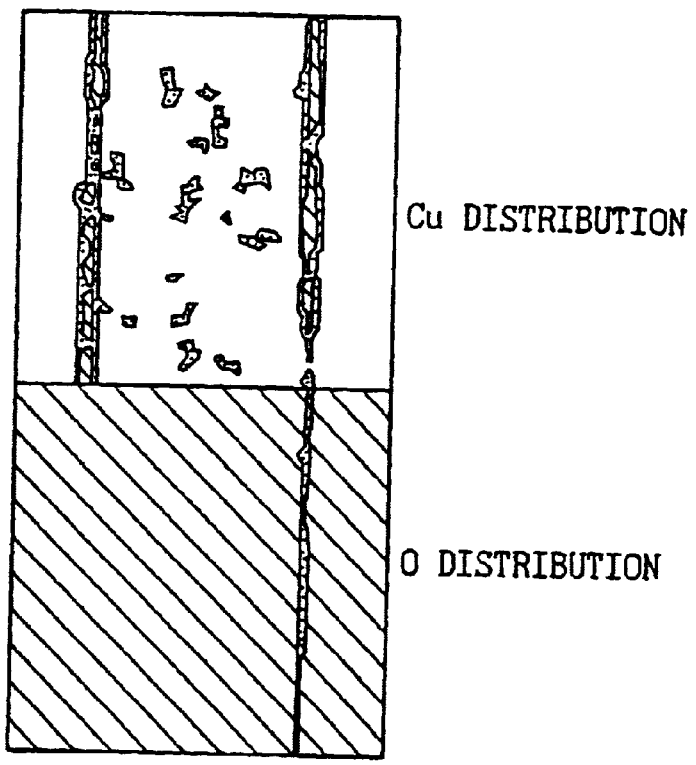
FIG. 9 is an explanatory view showing Cu and O distribution of a section of Comparative Example C1 in Embodiment 1.
Figure 10:
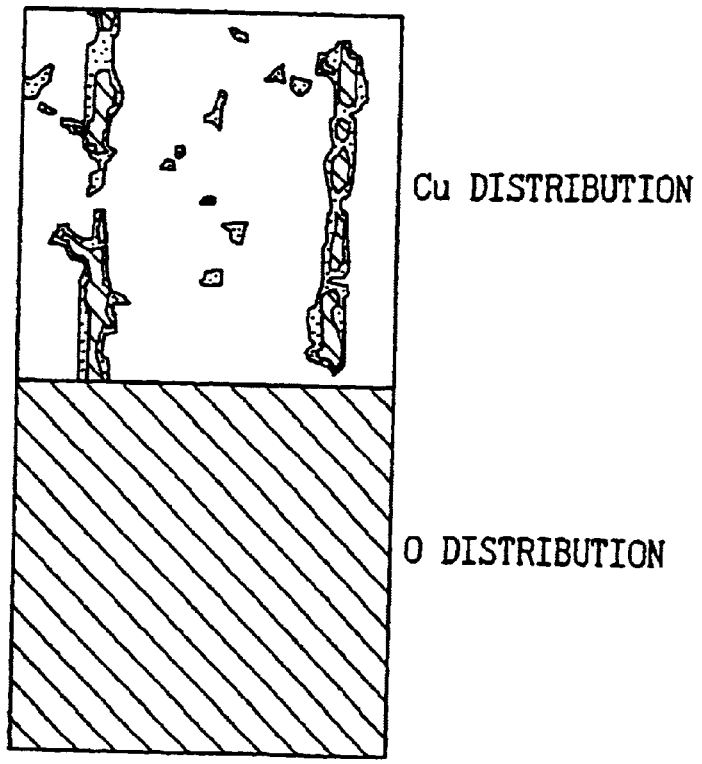
FIG. 10 is an explanatory view showing Cu and O distribution of a section of Comparative Example C2 in Embodiment 1.
Figure 11:
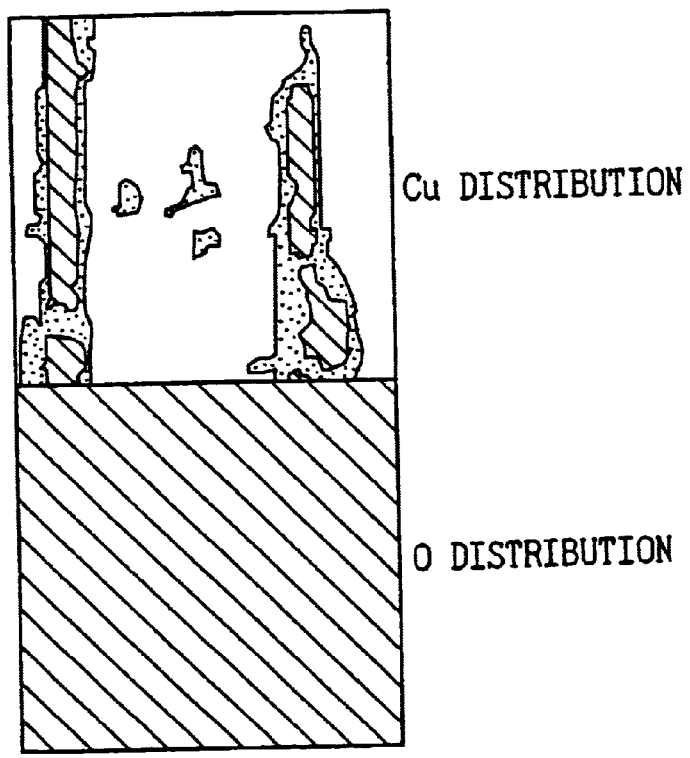
FIG. 11 is an explanatory view showing Cu and O distribution of a section of Comparative Example C3 in Embodiment 1.

It can be seen from FIGS. 9 to 11 that the disappearance of the electrode layer is great in Comparative Examples C1 to C3 and segregation of Cu as the electrically conductive base metal material exists inside the dielectric ceramic layer. In contrast, as can be seen from FIGS. 3 to 8, segregation of Cu was not observed, or is less, inside the dielectric ceramic layer in Examples E1 to E6. It can be thus understood that segregation of Cu can be suppressed by adding CaO as the melting restrictive material, or MgO or SrO as the melting point raising material, to the electrode paste material.

However, it can be understood that O is distributed also in the portions that should originally comprise Cu, due to the distribution of the component element O in all of Examples E1 to E6. In other words, the addition of CaO or MgO or SrO does not prevent oxidation of Cu.

In other words, at least a part of Cu as the conductive base metal material that constitutes the electrode was oxidized in the resulting laminate type dielectric device 1.

In the laminate type dielectric devices 1 of Examples E1 to E6, the distribution of Ca as the component element constituting the melting restrictive material or the distribution of Mg or Sr as the component element constituting the melting point raising material was observed inside, and in the proximity (boundary portion with the dielectric ceramic layer 11) of, the electrode layer 2 in the laminate type dielectric device 1 of Examples E1 to E6.

Embodiment 2:

This embodiment uses Examples E1 to E3 and Comparative Example C1 of Embodiment 1 as typical examples, changes the oxygen partial pressure in the baking process to about $10^{-5}$ atm, and produces the laminate type dielectric devices with the rest of the conditions remaining unaltered. The distributions of the component elements Cu and O in the section of each laminate product were measured in the same way as in Embodiment 1. FIGS. 12 to 15 illustrate the observation results.

As shown in these drawings, segregation of the component element Cu inside the dielectric ceramic layer could be restricted in only the laminate products that use the electrode paste material containing CaO, in the same way as in Embodiment 1.

Figure 16:
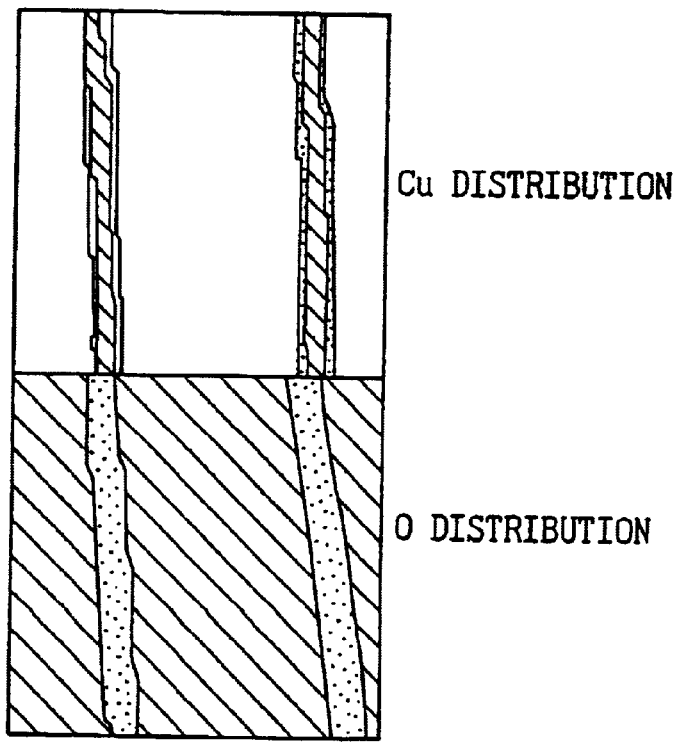
FIG. 16 is an explanatory view showing Cu and O distribution of a section of Comparative Example C1 in Embodiment 3.

Embodiment 3:

This embodiment uses Examples E1 to E3 and Comparative Example C1 of Embodiment 1 as typical examples, changes the oxygen partial pressure in the baking process to about $10^{-6}$ atm, and produces the laminate type dielectric devices with the rest of the conditions remaining unaltered. The distributions of the component elements Cu and O in the section of each laminate product were measured in the same way as in Embodiment 1. FIG. 16 represents the observation result of Comparative Example C1.

When the oxygen partial pressure in the baking process at 950° C. was changed to about $10^{-6}$ atm as shown in the drawing, segregation of the component element Cu was not observed in not only Examples E1 to E3 but also in the laminate product made of the electrode paste material of Comparative Example C1.

It can be understood from this result that segregation of the component element Cu in Example 1 results from mitigation of the reducing condition during baking. Incidentally, the difference of the degree of oxidation between the electrode layer and the dielectric ceramic layer is far greater than that of Examples 1 and 2 (as can be understood from the comparison of the component element O in FIGS. 3 to 16).

The region (width) having a small O distribution is greater (wider) as a whole than the region (width) having a large Cu distribution.

Figure 17:
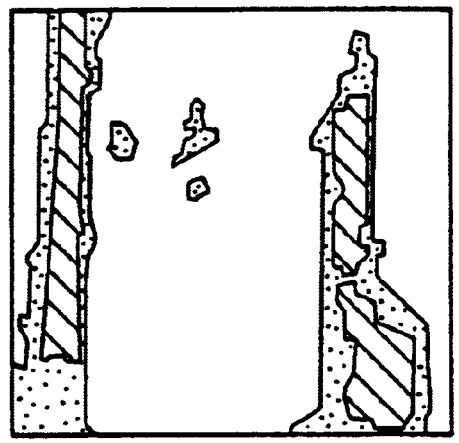
FIG. 17 is an explanatory view showing Cu distribution of a section of Comparative Example C3 in Embodiment 4.
Figure 18:
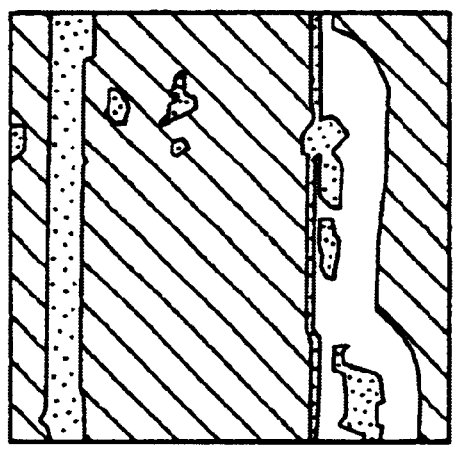
FIG. 18 is an explanatory view showing Ti distribution of a section of Comparative Example C3 in Embodiment 4.
Figure 19:
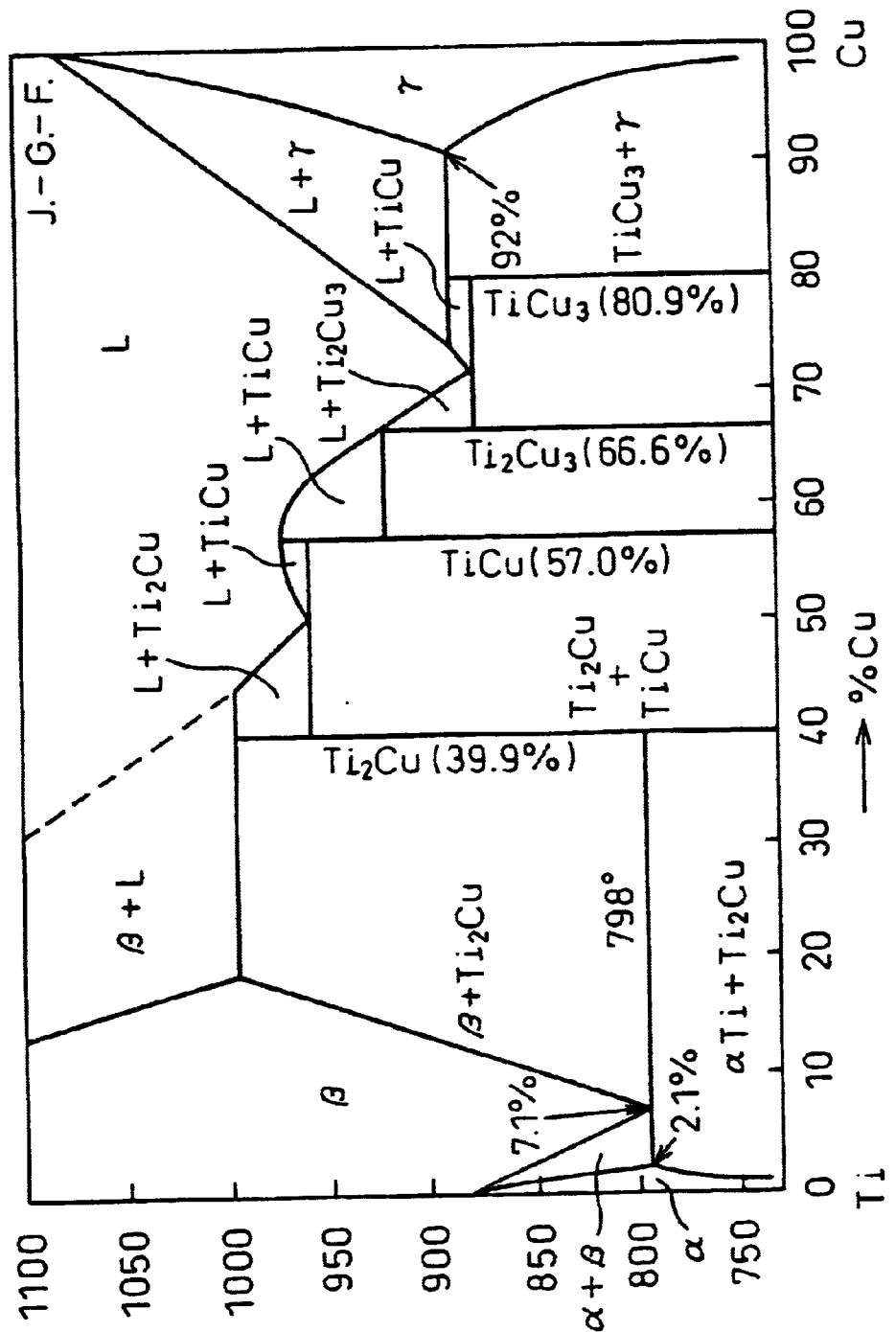
FIG. 19 is a phase equilibrium diagram of Cu and Ti.

Embodiment 4:

This embodiment measures the distribution of the component elements Cu and Ti of the laminate type dielectric devices produced by using the electrode paste material of Comparative Example C3 in Embodiment 1. The result is shown in FIGS. 17 and 18. The phase equilibrium diagram of Cu and Ti is shown in FIG. 19. It can be seen from the distribution of the component elements Cu and Ti that the cause of segregation is a mixture of Cu and Ti because titanium (Ti) exists in the segregation portion of Cu in the dielectric ceramic layer. It can be seen also from the phase equilibrium diagram of Cu and Ti that several composition zones, which lower the melting phenomenon from the melting point of Cu, i.e. 1,083° C., exist with the eutectic point of about 880° C. near Cu: 70%.

It can thus be understood that the mixture of Cu and Ti as the cause of segregation inside the dielectric ceramic layer is presumably a Cu—Ti alloy, and it is preferred that lowering of the melting point due to the eutectic does not exist in order to prevent segregation of Cu.

Embodiment 5:

In this embodiment, the following supplementary experiments were carried out for Examples E1, E2, E4 to E6 and Comparative Example C1 in Embodiment 1.

A small amount (20 wt %) of PbO that forms a liquid phase at a high temperature in the components of the ceramic material and activates the baking property was added to CuO as the electrode component and the additives (CaO, MgO, SrO) in the composition of each electrode paste material, and thermal analysis was conducted (Tg-DTA). The atmosphere of the sample at this time was air. The results are shown in FIGS. 20 to 24. The temperature (° C.) is plotted on the abscissa and the weight (mg) and calorie are plotted on the ordinate in these drawings.

Figure 20:
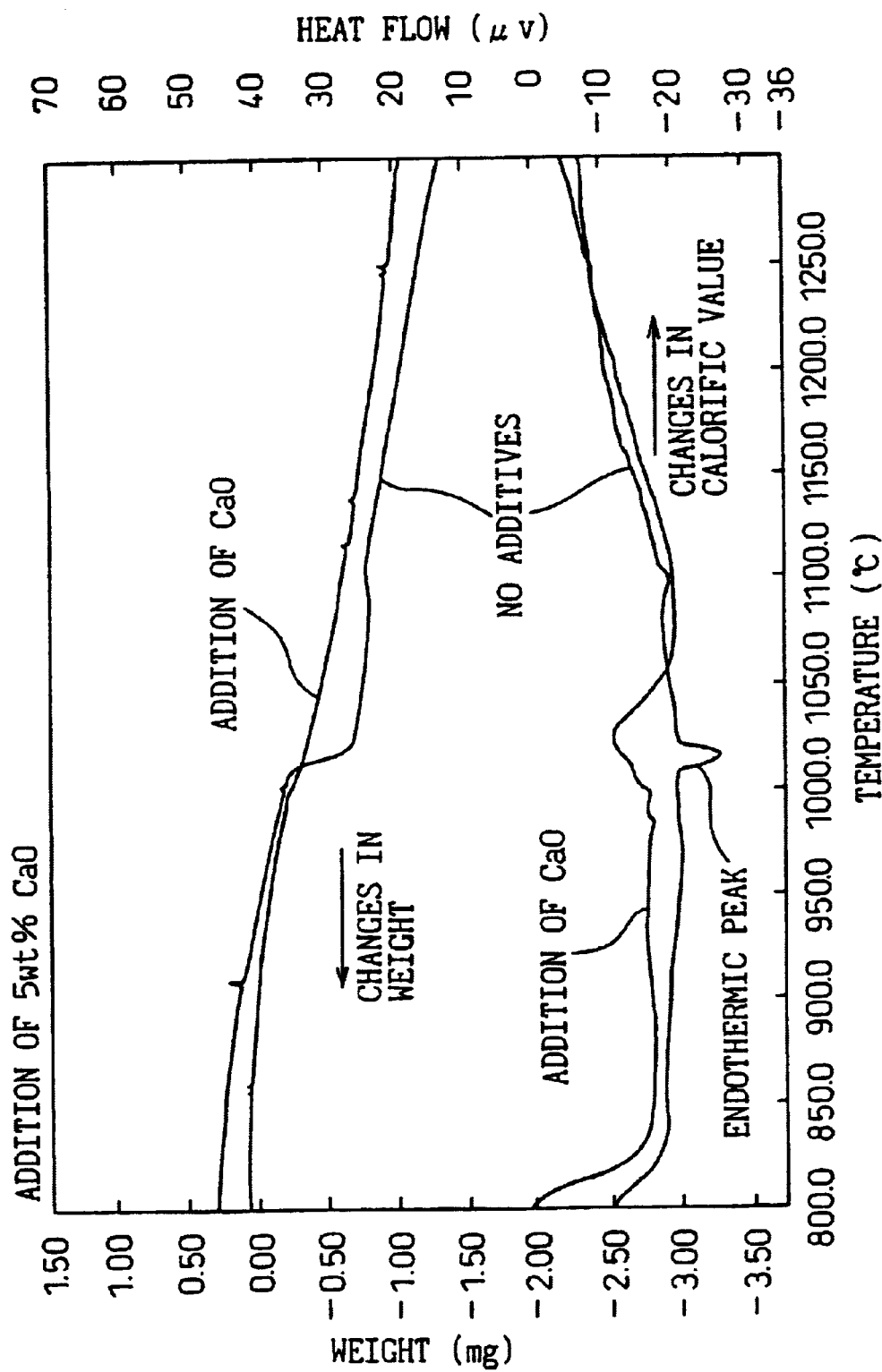
FIG. 20 is an explanatory view showing a thermal analysis result of Example E1 in Embodiment 5.
Figure 21:
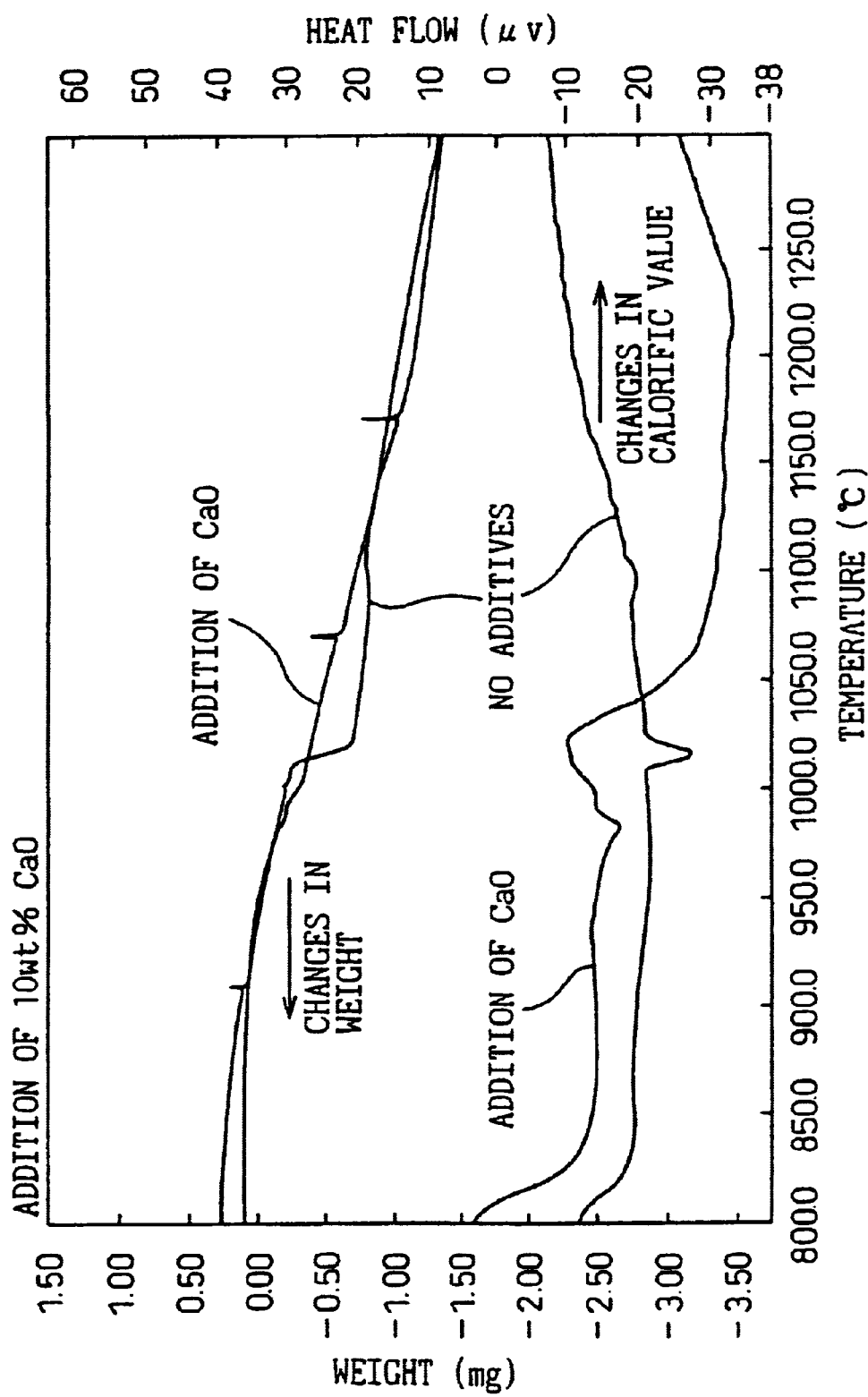
FIG. 21 is an explanatory view showing a thermal analysis result of Example E2 in Embodiment 5.
Figure 22:
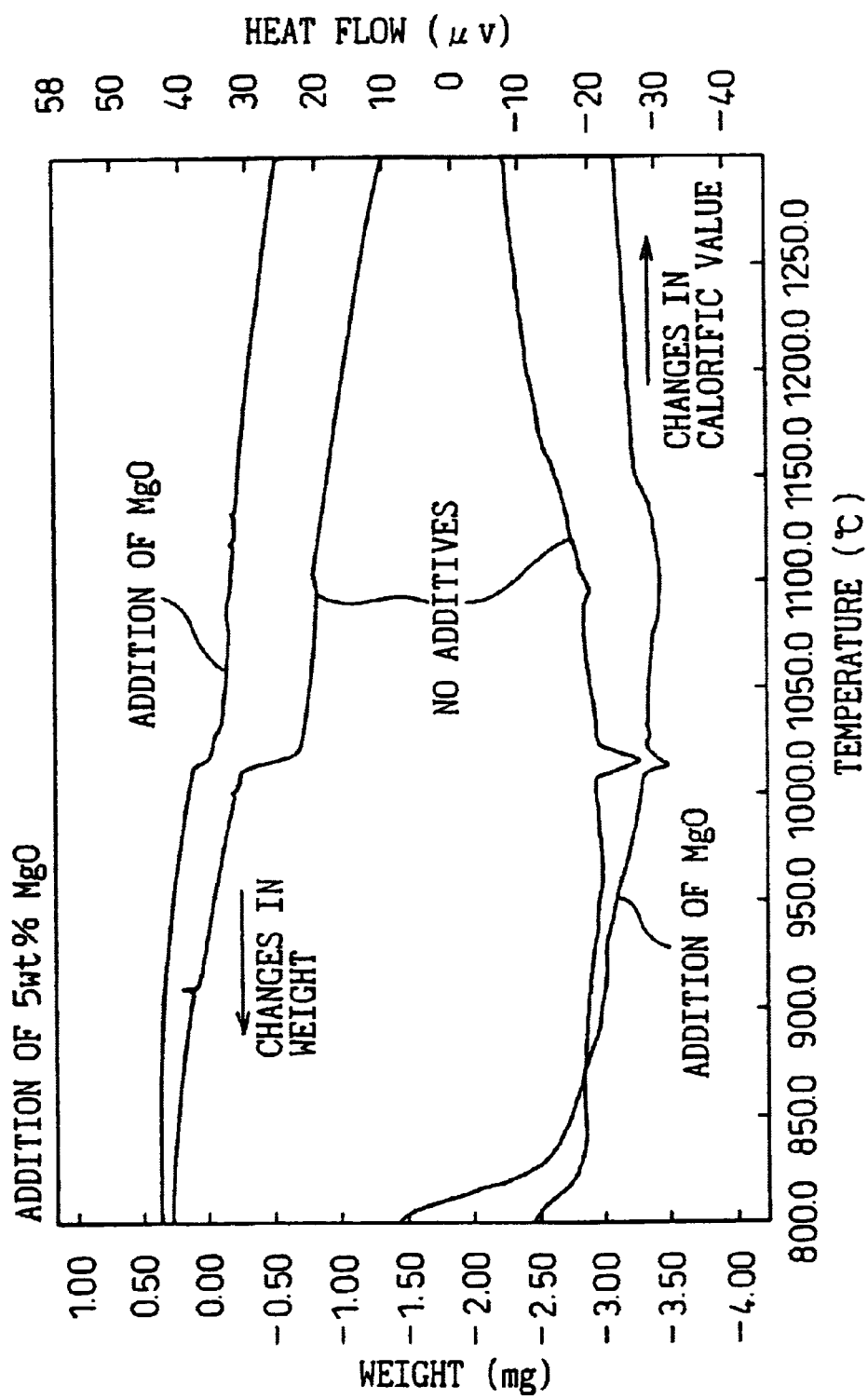
FIG. 22 is an explanatory view showing a thermal analysis result of Example E4 in Embodiment 5.
Figure 23:
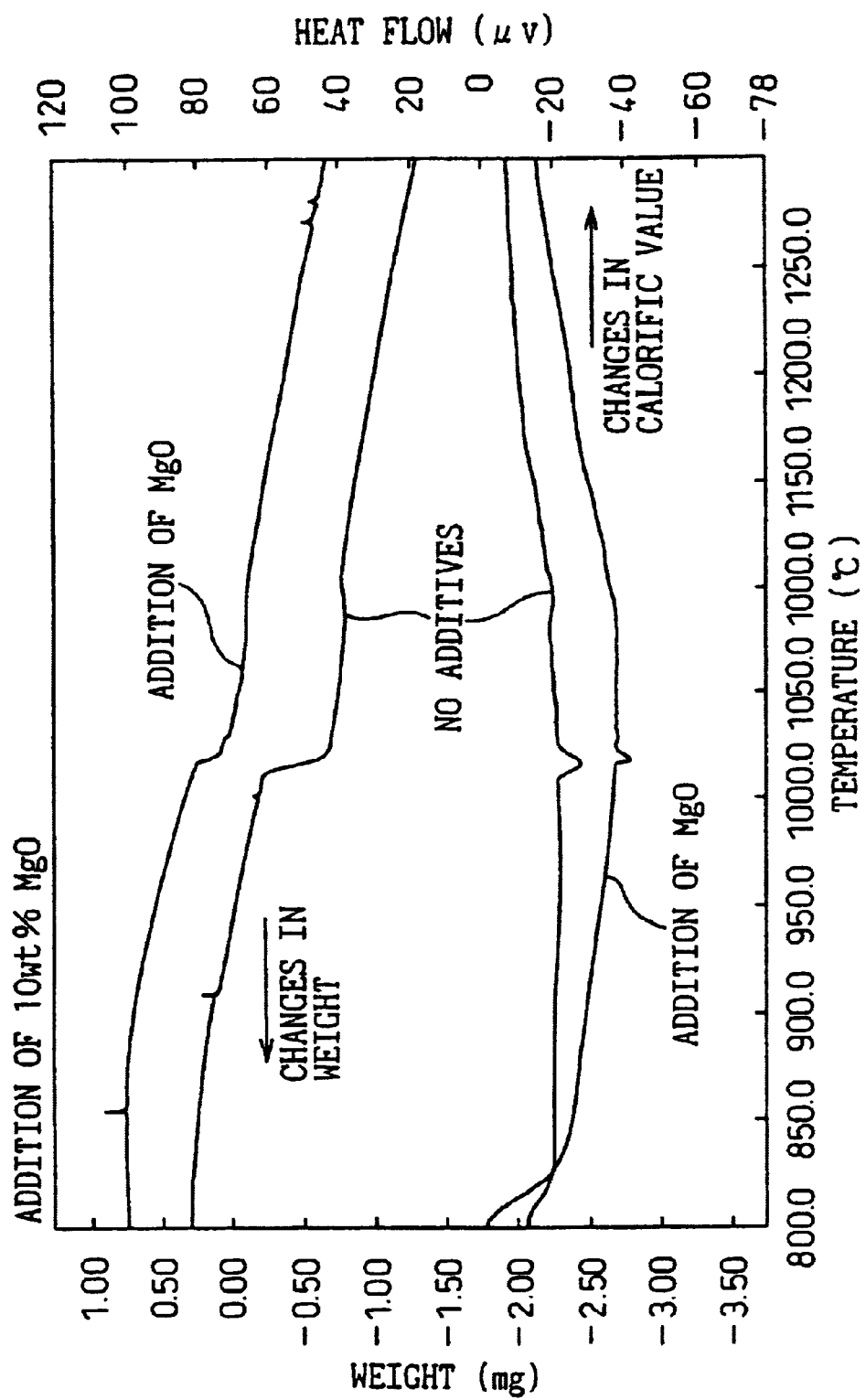
FIG. 23 is an explanatory view showing a thermal analysis result of Example E5 in Embodiment 5.
Figure 24:
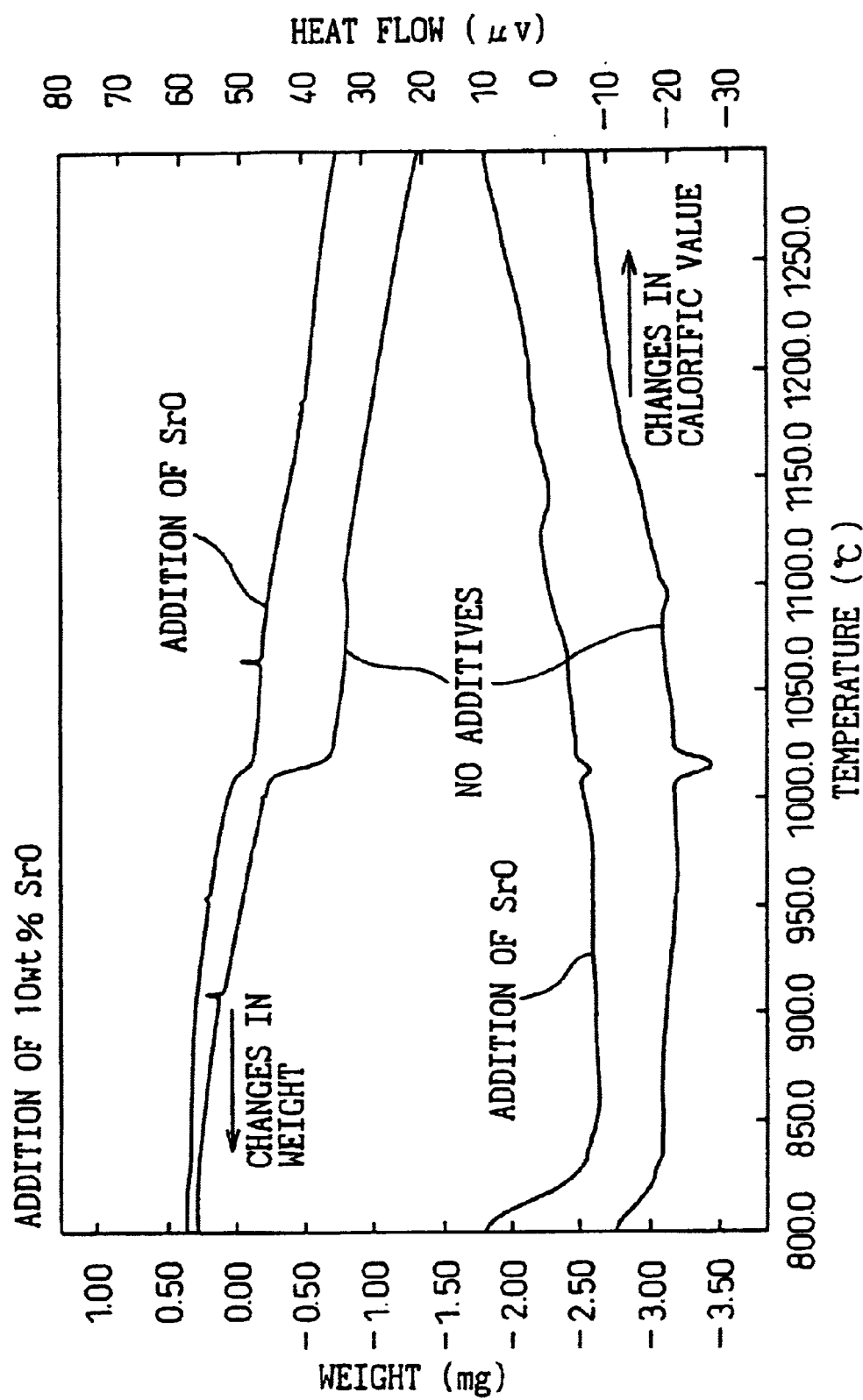
FIG. 24 is an explanatory view showing a thermal analysis result of Example E6 in Embodiment 5.

As shown in FIGS. 20 to 24, when no additive is added to the electrode paste material of Comparative Example 1, an endothermic peak exists within the temperature range of 1,000 to 1,050° C. and the phase transition (melting) develops. In contrast, in Examples E1 and E2 in which CaO was added, the endothermic reaction, that is, melting, was suppressed in this temperature range as shown in FIGS. 20 and 21.

Figure 25:
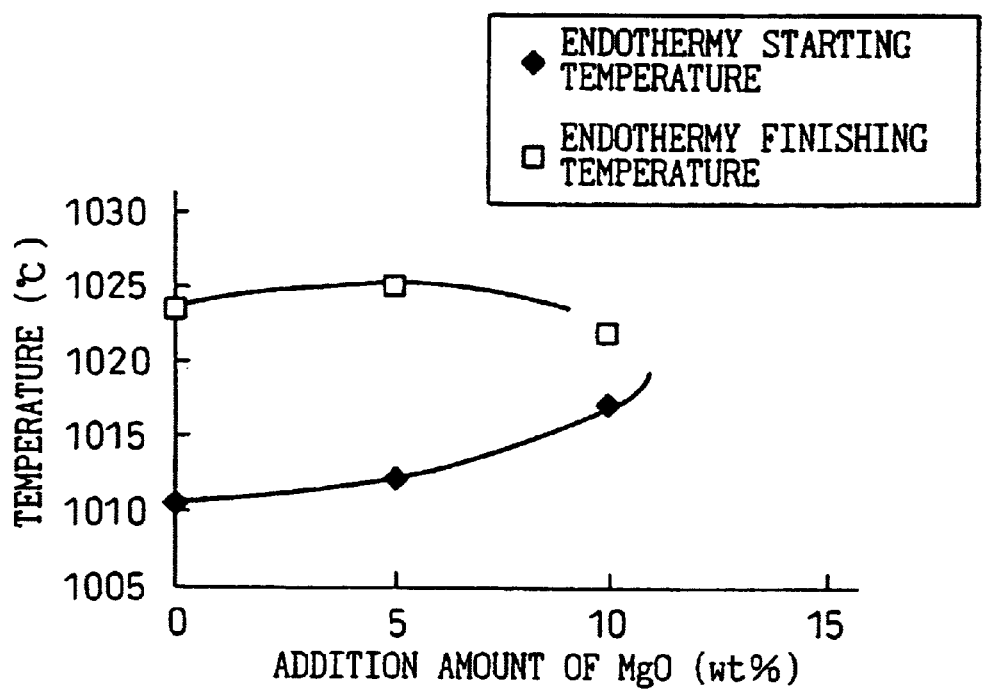
FIG. 25 is a phase equilibrium diagram when MgO is added in Embodiment 5.
Figure 26:
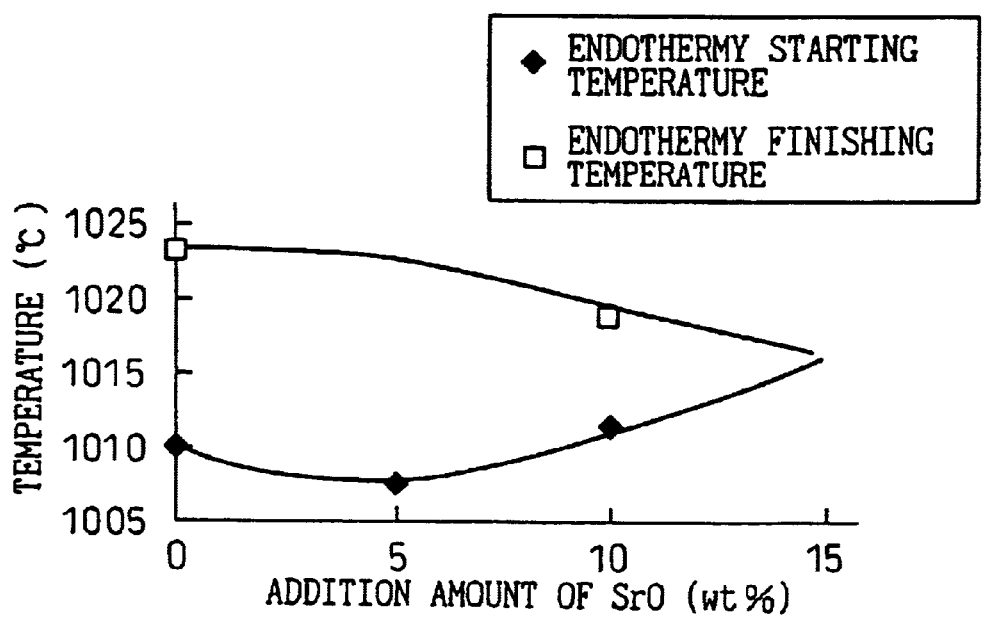
FIG. 26 is a phase equilibrium diagram when SrO is added in Embodiment 5.

FIGS. 25 and 26 are the phase equilibrium diagrams when the additive is not added (material of Comparative Example C1) and when the additive is added within the range of 5 and 10 wt %, on the basis of the phase transition temperature (1,000 to 1,050° C.) of the materials of Examples E4 and E5, in which MgO is added, and Example E6 in which SrO is added.

In these drawings, the abscissa represents the addition amount of MgO or SrO, and the ordinate represents the temperature.

A phase equilibrium diagram of a complete solid solution system is prepared for the material of the system to which MgO is added, as shown in FIG. 25. When 10 wt % of SrO is added, too, the endothermy starting temperature rises.

The CaO- and MgO-containing material in Example E1 that suppresses segregation and diffusion of Cu suppresses the endothermic reaction at 1,000 to 1,050° C., or raises the temperature. As shown in FIG. 26, when 10 wt % SrO is contained as in Example E6, the endothermic reaction at 1,000 to 1,050° C. becomes higher than when SrO is not added. It can be understood from these facts, too, that segregation of Cu can be suppressed in Example E6 as shown in FIG. 8.

Even though the endothermic reaction (melting) temperature is 1,000 to 1,050° C., this temperature does not always correspond absolutely to the reaction temperature inside the actual dielectric ceramic layer for the following factors (1) to (3). Therefore, only relative comparison depending on the existence/absence of the additives is effective.

(1) In the result of the thermal analysis (Tg-DTA) given above, the temperature elevation rate is 5° C./min, and the resulting data shifts to a higher temperature side than the actual reaction temperature.

(2) Of the liquid phase that plays the role of promoting baking of the dielectric ceramic layer, the amount that is involved in the reaction with the electrode is not known, and the actual melting point is different from the melting point in this example.

(3) When $Cu_2O$ and $CuO$ are mixed, the melting point further drops due to the eutectic reaction in comparison with when CuO is used alone or when $Cu_2O$ is used alone.

In other words, when the laminate type dielectric device is integrally shaped by adding the additive for suppressing the endothermic reaction at 1,000 to 1,050° C., that may presumably result from melting of the eutectic material of $Cu(CuO, Cu_2O)$ or $Cu(CuO, Cu_2O)$ and PbO or raising the reaction temperature to the electrode paste material, segregation and diffusion of Cu as the conductive base metal material or the Cu oxide into the dielectric ceramic layer can be suppressed.

Embodiment 6:

This embodiment represents an example of a piezoelectric actuator 10 produced by using the electrode paste material given in Embodiment 1.

Figure 27:
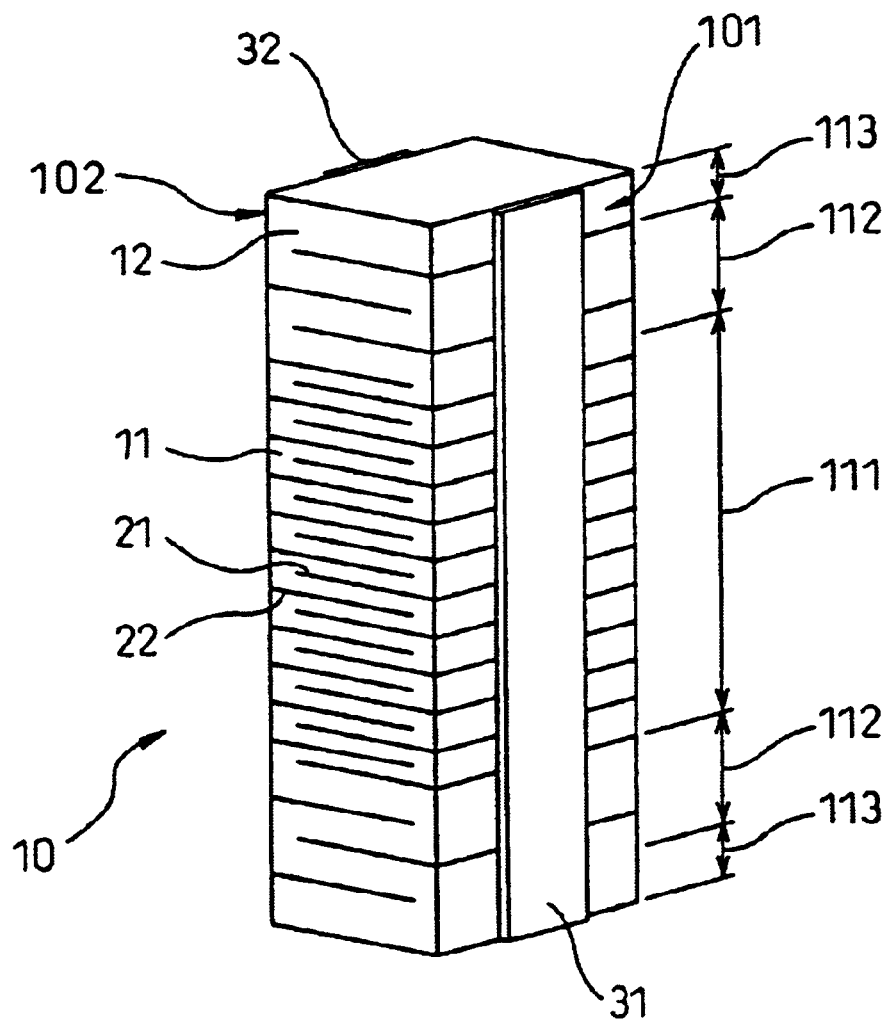
FIG. 27 is a perspective view showing a piezoelectric actuator in Embodiment 6.

This piezoelectric actuator 10 is produced by alternately forming inner electrode layers (electrode layers) 21 and 22 to positive and negative inside a piezoelectric layer (dielectric ceramic layer) 11 as shown in FIG. 27. One 21 of the inner electrode layers is so disposed as to be exposed on one 101 of the side surfaces while the other inner electrode layer 22 is so disposed as to be exposed to the other side surface 102. Outer electrodes 31 and 32 are formed on the side surfaces 101 and 102 of the piezoelectric device 10 by baking silver in such a fashion as to electrically connect the end portions of the exposed inner electrode layers 21 and 22, respectively.

Baked silver that forms the outer electrodes 31 and 32 is the electrodes formed by baking an Ag paste, and has a composition consisting of Ag (97%) and a glass frit component (3%) as will be described later.

Outer electrodes are bonded onto the outer electrodes 31 and 32 by using resin with silver (not shown in the drawing). Resin silver for bonding the outer electrodes has a composition consisting of 80% of Ag and 20% of an epoxy resin.

In the piezoelectric actuator 10, the center portion in the laminating direction is a driving portion 111, portions so arranged as to sandwich the driving portion are buffer portions 112 and portions so arranged as to further sandwich the buffer portions 112 are dummy portions 113.

It is noteworthy that the paste of Example E1 of Embodiment 1 was used as the electrode paste material for forming the inner electrode layers 21 and 22. Since it became thus possible to prevent Cu, forming the inner electrode layers 21 and 22, from being melted and invading the dielectric ceramic layer 11 of the upper and lower layers during integral baking, integral baking could be carried out under a baking condition that is advantageous for performance of the dielectric ceramic layer 11.

In consequence, the dielectric ceramic layer 11 has sufficiently excellent characteristics, and segregation of the Cu-containing compound into the dielectric ceramic layer 11 can be suppressed. The drop of characteristics of the dielectric ceramic layer and the occurrence of cracks resulting from segregation of Cu inside the dielectric ceramic layer can be sufficiently suppressed, too.

Therefore, the resulting piezoelectric actuator 10 is economical and permits the dielectric ceramic layer to fully exhibit its characteristics.

Embodiment 7:

This embodiment explains the case where both of a Ca compound and an Mg compound are added to the electrode paste material in comparison with the case where only the Ca compound or only the Mg compound is added.

To clarify the differences, a comparison is made within the range where the CuO content in the electrode paste material is 62 wt %, voids develop in the electrode layer, the strength does not easily elevate and peeling is likely to occur. The electrode paste also contains 38 wt % in total of an organic vehicle and a resin agent.

Further, 5 wt % of additives are added to 100 parts by weight in total of CuO, the organic vehicle and the resin agent of the electrode paste material. The case where 2.5 wt % of MgO and 2.5 wt % of CaO is added as the additives is Sample 1. The case where 5 wt % of only MgO is added as the additive is Sample 2, and the case where 5 wt % of CaO is added is Sample 3. The production method of the electrode paste material is the same as that of Embodiment 1.

Next, the green sheets made of the ceramic material are laminated while interposing the electrode paste material between them in the same way as in Embodiment 1 and are then baked integrally. The number of lamination is 100 layers. There is thus obtained a 10 mm-thick lamination type dielectric device.

Figure 28:
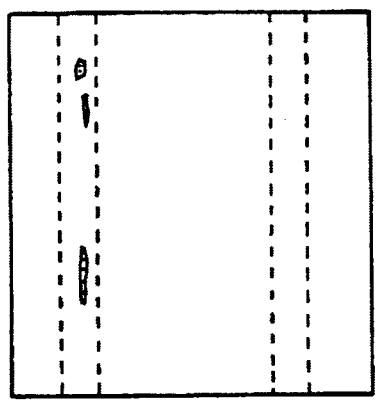
FIG. 28 is an explanatory view showing Mg distribution in a section of a laminate type dielectric device produced by using an electrode paste material of Sample 1 in Embodiment 7.
Figure 29:
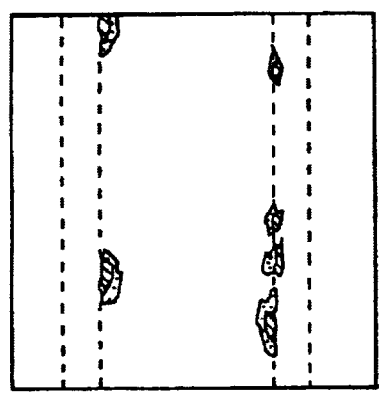
FIG. 29 is an explanatory view showing Ca distribution in a section of a laminate type dielectric device produced by using an electrode paste material of Sample 1 in Embodiment 7.
Figure 30:
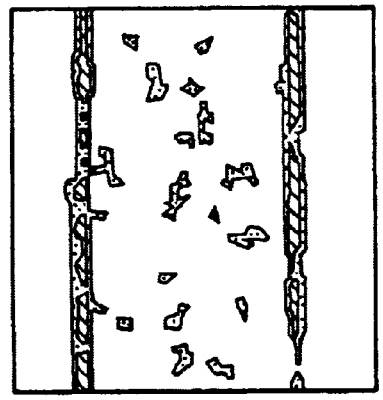
FIG. 30 is an explanatory view showing Cu distribution in a section of a laminate type dielectric device produced by using an electrode paste material of Sample 3 in Embodiment 7.
Figure 31:
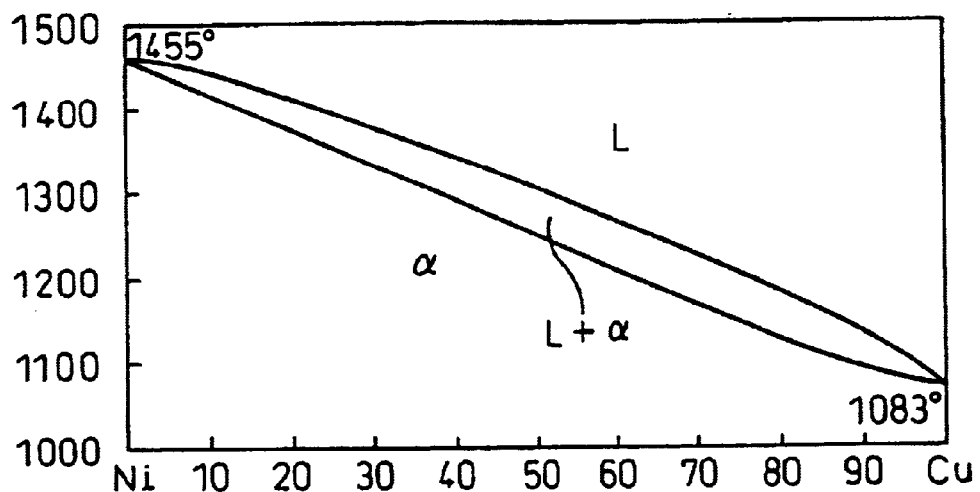
FIG. 31 is a phase equilibrium diagram of Ni—Cu.
Figure 32:
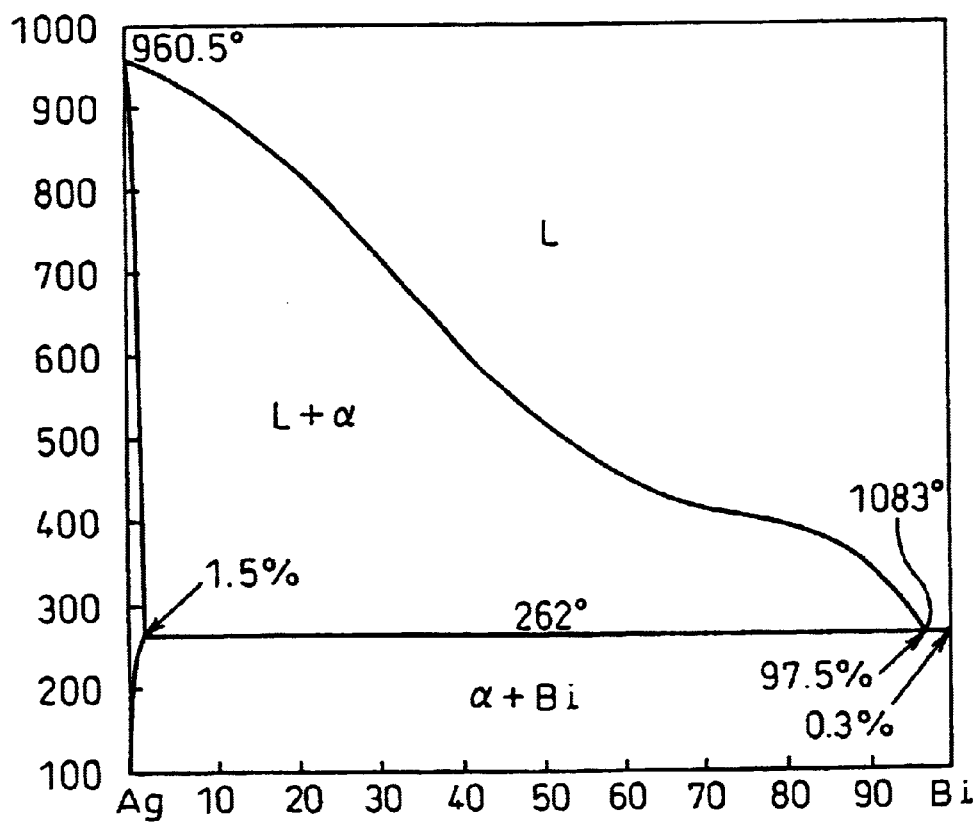
FIG. 32 is a phase equilibrium diagram of Ag—Bi.

FIGS. 28 and 29 schematically show the distribution of Mg and Ca in Sample 1, and FIG. 30 schematically shows the distribution of Cu in Sample 3. In the drawings, hatching is applied to portions having relatively high concentrations.

In Sample 1 (containing 2.5 wt % MgO and 2.5 wt % CaO), diffusion and segregation of the component element Cu into the dielectric ceramic layer are not at all observed in the same way as in the three-layered product of Example 1, and cracks do not occur, either. As can be clearly seen from FIGS. 28 and 29, the component element Mg is distributed inside the electrode layer 2, and the component element Ca is distributed in the interface between the dielectric ceramic layer 11 and the electrode layer 2 or in the portion of the dielectric ceramic layer 11 in the proximity of the interface.

In contrast, in Sample 2 (containing only 5 wt % of MgO), segregation and diffusion of the component element Cu into the dielectric ceramic layer are not observed in the same way as in Sample 1. However, four samples among six samples are broken into two pieces due to their own weight when the end portion of the laminate type dielectric devices is pulled up after baking. Among all these four samples broken into two pieces, peeling occurred in the boundary surface between the electrode layer and the dielectric ceramic layer.

In Sample 3 (containing 5 wt % CaO), on the other hand, diffusion of the component element Cu occurs much more than in the three-layered laminate product of Embodiment 1 as shown in FIG. 30. However, peeling of the laminate type dielectric device does not occur.

It can be understood from the result given above that the laminate type dielectric device can be produced more easily by using the paste material (Sample 1) to which both MgO and CaO are added than by using the paste materials (Samples 2 and 3) to which MgO alone or CaO alone is added.

It can be estimated from the results shown in FIGS. 28 to 30 that both of the component elements Mg and Ca suppress diffusion and segregation of the electrode materials, and the compound of the component element Ca reacts with the ceramic material and improves the bonding strength between the dielectric ceramic layer and the electrode layer.

Embodiment 8:

In this embodiment, performance (electrostatic capacity) of three kinds of samples (Samples 1 to 3) produced in Embodiment 7 is measured.

The electrostatic capacity of Sample 1 is 312 nF (n=nano=$10^{-9}$).

In Sample 2, measurement could not be made because peeling occurred between the electrode layer and the dielectric ceramic layer in all the remaining samples at the time of baking and grinding of the outer periphery for fitting the outer electrode.

In Sample 3, though measurement was attempted, the result is in the order of pF ($p=10^{-12}$) and remains at the same level as the error level, and the value hardly rises.

It can be understood from the results given above that the electrostatic capacity can be normally obtained only when both of MgO: 2.5 wt % and CaO: 2.5 wt % are added as in Sample 1 if the Cu content in the paste material is lowered to 62 wt % and the paste material in the region where voids develop is used. The reason why Sample 1 has such high performance is presumably because diffusion and segregation of Cu can be suppressed when both MgO and CaO are added, and sufficient bonding can be acquired.

Incidentally, the material of the side surface electrode in the foregoing examples may contain any one of Cu, Pt, Ni and Pd besides Ag.

Though this Embodiment represents a piezoelectric actuator, laminate type ceramic capacitors having high quality can be likewise obtained by using the excellent electrode paste material described above.

Embodiment 9:

This embodiment uses Samples E7 to E15 shown in Table 2 but changes the oxygen partial pressure in the baking process to about $10^{-5}$ atm. Three-layered laminate products as the laminate type dielectric device are produced in the same way as in Embodiment 1 with the rest of the conditions remaining unaltered. The distribution of the component element Cu in the section of each laminate product is measured in the same way as in Embodiment 1.

Samples E8 to E10: Additive=CaO

Figure 12:
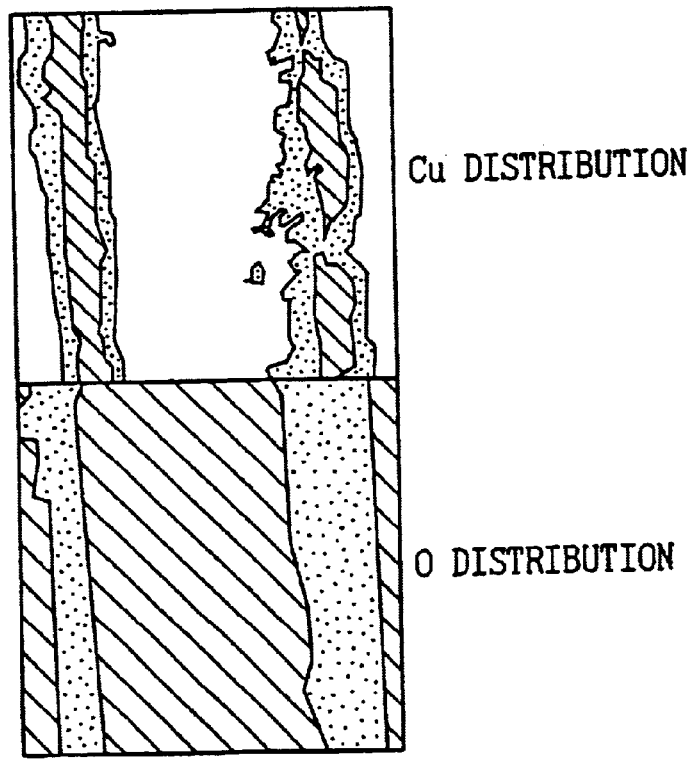
FIG. 12 is an explanatory view showing Cu and O distribution of a section of Example E1 in Embodiment 2.
Figure 13:
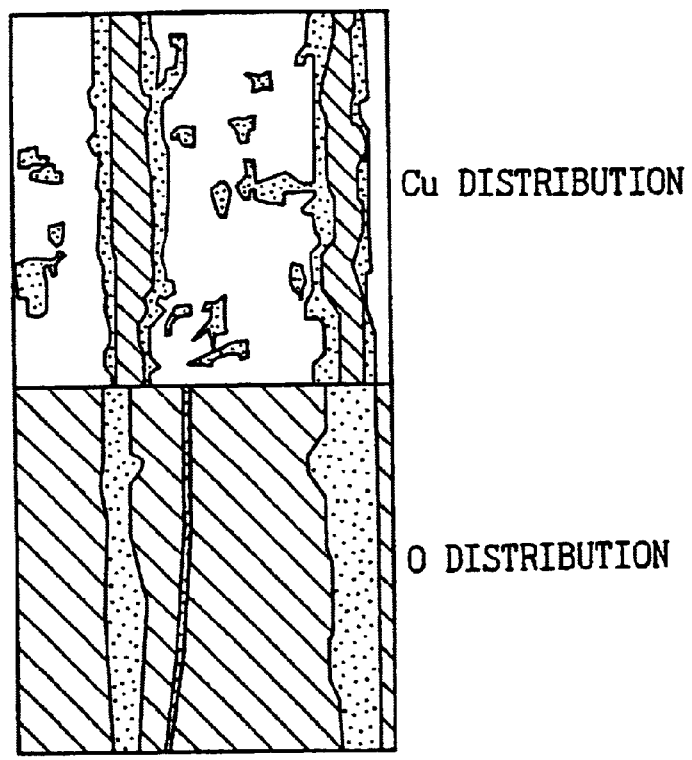
FIG. 13 is an explanatory view showing Cu and O distribution of a section of Example E2 in Embodiment 2.

In Sample E8, diffusion of the component element Cu occurs in the same way as in FIG. 12 but segregation in the PZT material is restricted.

In Sample E9, however, segregation of the component element Cu is observed in the PZT material.

Figure 14:
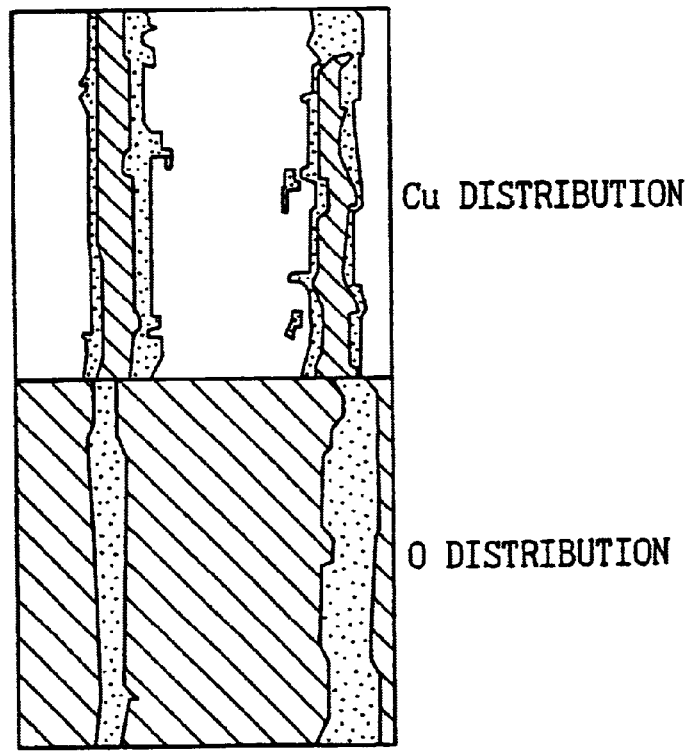
FIG. 14 is an explanatory view showing Cu and O distribution of a section of Example E3 in Embodiment 2.
Figure 15:
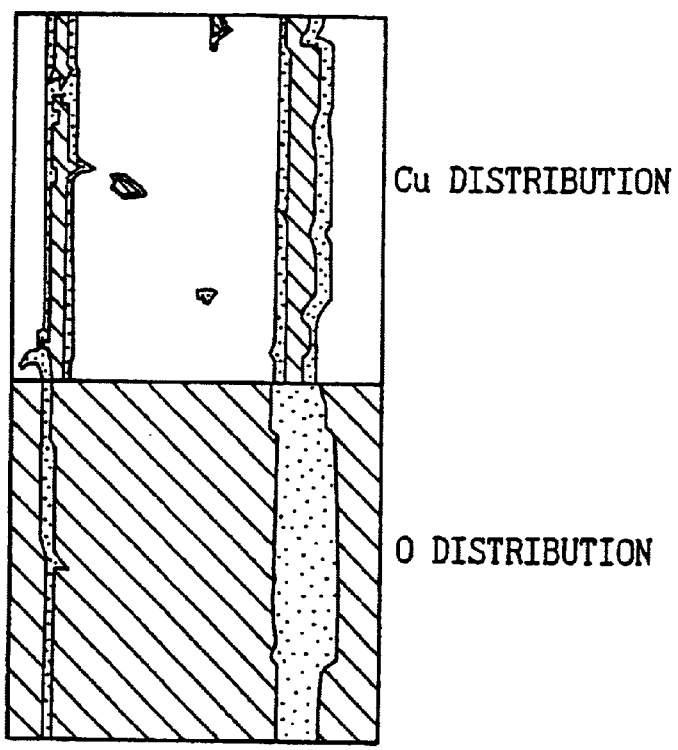
FIG. 15 is an explanatory view showing Cu and O distribution of a section of Comparative Example C1 in Embodiment 2.

In Sample E10, both segregation and diffusion of the component element Cu can be suppressed in the same way as in FIG. 14, but the specific resistance drastically increases. For example, whereas the specific resistance is $4.5 \times 10^{-4}$ Ωm in Sample E8, it is $1.8 \times 10^{-3}$ Ωm in sample E10.

Therefore, the addition amount of CaO is preferably from 1 to 15 wt %.

Samples E7, E11, E12, E15: Additive=MgO

Figure 6:
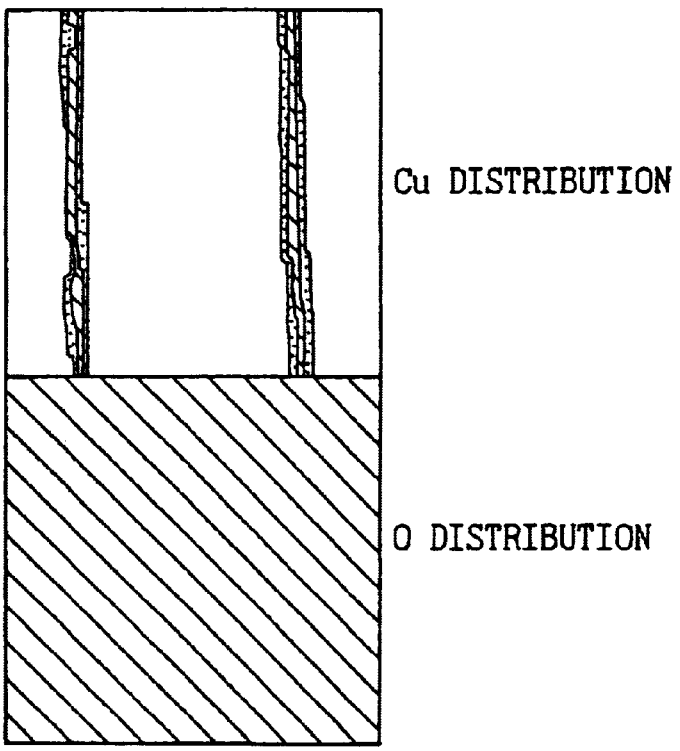
FIG. 6 is an explanatory view showing Cu and O distribution of a section of Example E4 in Embodiment 1.
Figure 7:
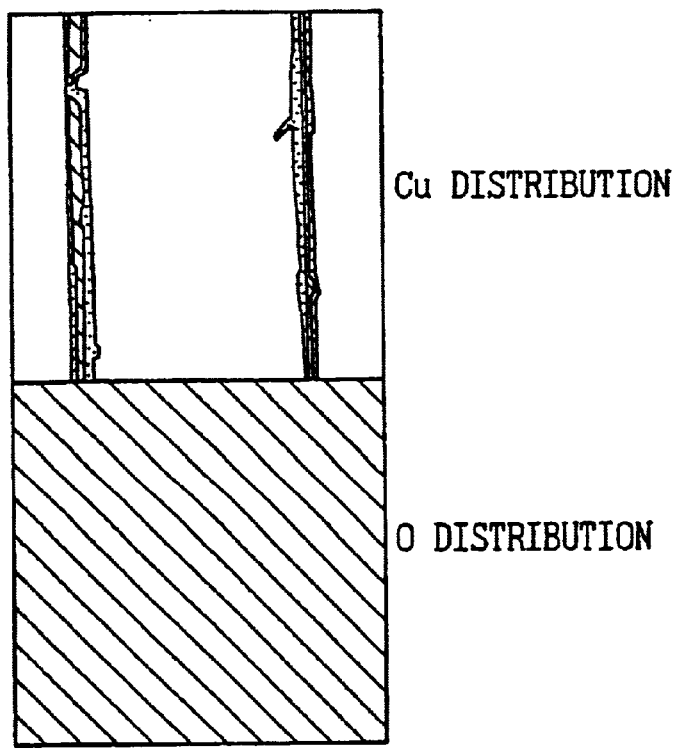
FIG. 7 is an explanatory view showing Cu and O distribution of a section of Example E5 in Embodiment 1.

In Sample E7, segregation and diffusion of the component element Cu can be suppressed in the same way as in FIG. 6. It can be understood from this result in combination with the result of sample E8 that even when the principal component is the mixture of CuO powder and Cu powder, the effect of suppressing segregation and diffusion remains the same.

When the distribution of the component element Mg is observed in Sample E7, Mg is observed inside the electrode layer in the same way as in FIG. 28.

Segregation of the component element Cu is not observed in Sample E11, either. When the distribution of the component element Mg is observed at this time, it cannot be detected.

In other words, even when the addition amount of MgO is so small an amount that it cannot be detected, it can eliminate segregation of the component element Cu and can suppress diffusion.

In Sample E12, too, segregation and diffusion of the component element Cu can be suppressed.

In Sample E15, too, segregation and diffusion of the component element Cu can be suppressed. However, the specific resistance of the electrode drastically increases. The specific resistance of each electrode is $2.5 \times 10^{-4}$ Ωm in E7, $3.0 \times 10^{-4}$ Ωm in E11, $7.2 \times 10^{-4}$ Ωm in E12 and $2.5 \times 10^{-3}$ Ωm in E15. Therefore, the addition amount of MgO is preferably from 0.2 to 20 wt %.

Samples E13 and E14: Additive=SrO

Figure 34:
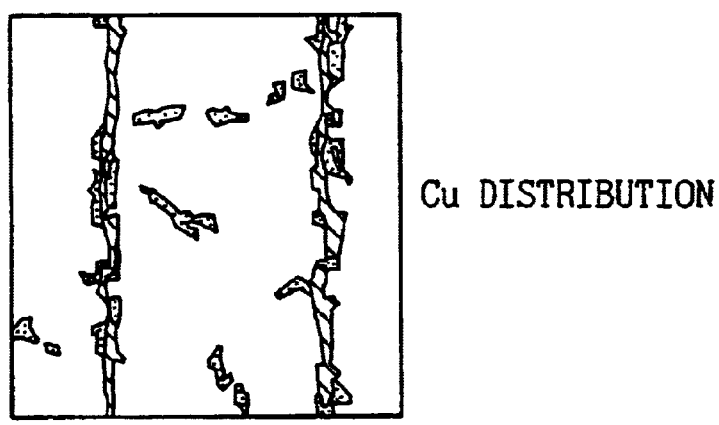
FIG. 34 is an explanatory view showing Cu distribution in a section of a laminate type dielectric device produced by using an electrode paste material of Sample E13 in Embodiment 9.

In Sample E13, diffusion of the component element Cu is observed as shown in FIG. 34, but segregation in the PZT sample can be suppressed.

In contrast, in Sample E14, segregation of Cu in the PZT material is observed.

Therefore, the addition amount of SrO is preferably from 10 to 15 wt %.

TABLE 2

| Sample No. | organic vehicle and resin | CuO powder | Cu powder | subtotal | additives (wt %) |
|---|---|---|---|---|---|
| E7 | 35.0 | 35.0 | 30.0 | 100.0 | MgO:1 |
| E8 | 33.0 | 37.0 | 30.0 | 100.0 | CaO:3 |
| E9 | 33.0 | 37.0 | 30.0 | 100.0 | CaO:1 |
| E10 | 33.0 | 37.0 | 30.0 | 100.0 | CaO:20 |
| E11 | 33.0 | 37.0 | 30.0 | 100.0 | MgO:0.2 |
| E12 | 33.0 | 37.0 | 30.0 | 100.0 | MgO:20 |
| E13 | 33.0 | 37.0 | 30.0 | 100.0 | Sr:15 |
| E14 | 33.0 | 36.0 | 31.0 | 100.0 | Sr:5 |
| E15 | 33.0 | 36.0 | 31.0 | 100.0 | MgO:25 |

Embodiment 10:

When thermal analysis is conducted about the case where the addition amount of SrO is 5 wt % in the same way as in Embodiment 5, the endothermy starting temperature is about 1,008° C. It can be understood from this result that the addition of SrO can cause the eutectic reaction. However, when the addition amount of SrO is 10 wt %, the temperature becomes higher (1,010° C. to 1,012° C.) than when no additive is added, and SrO can be added as the melting point raising material within the range in which the addition amount is small.

Next, $Cu_2O$ is mixed with a Pb-containing PZT material and the mixture is thermally analyzed in a $N_2$ atmosphere. The result is shown in FIG. 35.

The difference from Embodiment 5 resides in the material and the atmosphere.

When $Cu_2O$ is mixed with the Pb-containing PZT material, a value of 959° C. can be obtained at 50 wt %. When 5 wt % of CaO or MgO is added to this composition, the endothermic peak does not clearly appear when CaO is added.

Figure 35:
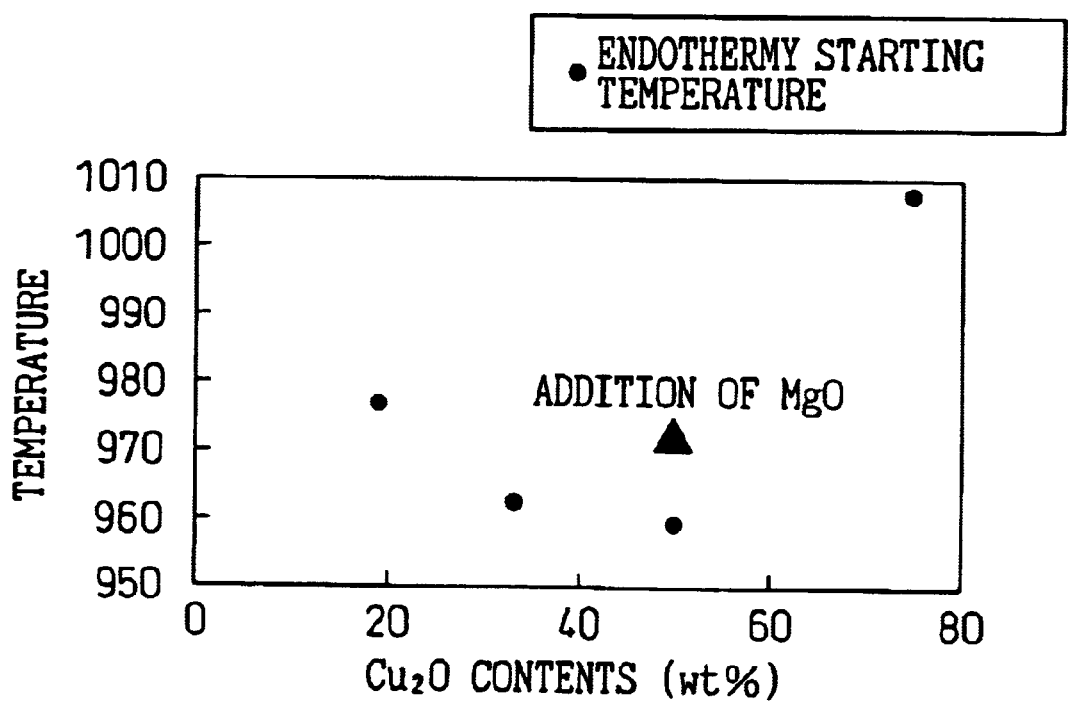
FIG. 35 is an explanatory view showing a thermal analysis result (phase equilibrium diagram) in Embodiment 10.
Figure 36:
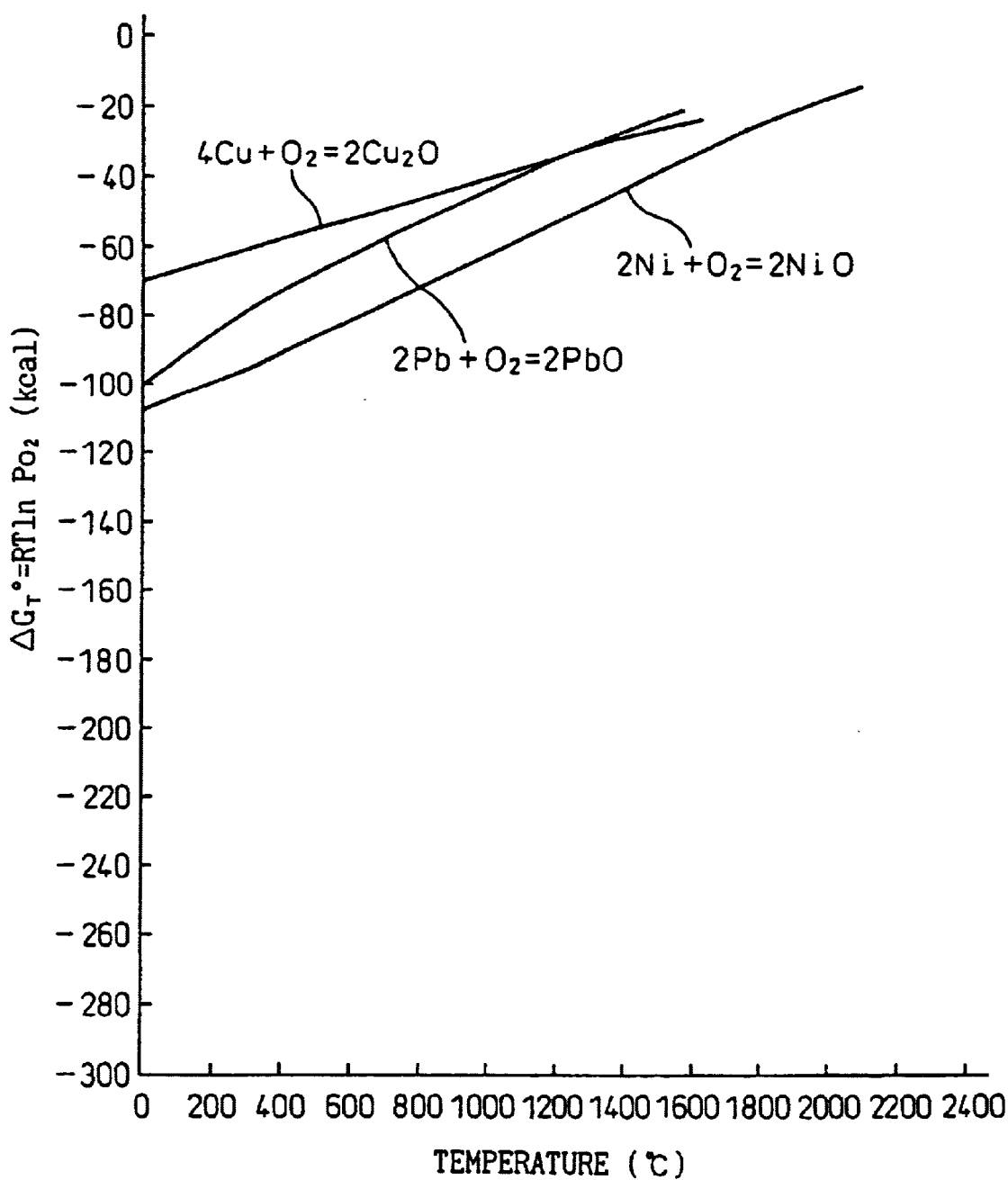
FIG. 36 is an explanatory view showing a temperature change of standard Gibbs free energy in the formation of Cu, Ni and Pb metal oxides.

When MgO is added, the endothermy starting temperature rises (from 959° C. to 972° C.) as shown in FIG. 35.

It can be understood from the result given above that the oxidization state of the electrode material provides the same effect in both $Cu_2O$ and CuO.

Embodiment 11:

This embodiment produces 10 mm-thick laminate products as the laminate type dielectric device by using Samples E16 to E21 in Table 3 in the same way as in Embodiment 9. The number of lamination of the dielectric ceramic layer is 100 layers. The distribution of the component element Cu of each laminate product is measured in the same way as in Embodiment 1.

A cooperative material 1 or 2 is added to the electrode paste material of this embodiment as tabulated in Table 3.

To prepare the cooperative material 1, powder of the principal starting material of the dielectric ceramic layer, such as lead oxide, zirconium oxide, titanium oxide, niobium oxide, strontium carbonate, or the like, is first weighed to attain a desired composition in the same way as in Embodiment 1. The lead content is weighed to be by about 1 to 2% richer than the stoichiometric ratio of the mixture composition in consideration of evaporation of lead. The mixture is dry mixed by using a mixer and is then calcined at 800 to 900° C. The calcined powder is pulverized to provide the cooperative material 1.

The preparation method of the cooperative material 2 is based on the production method of the cooperative material 1. Namely, lead oxide is omitted and the calcining temperature is set to 1,450° C. with the rest of the conditions remaining unaltered. There is thus obtained the cooperative material 2.

The measurement result of the distribution of the component element Cu is as follows. Diffusion and segregation cannot be observed in Samples E16 to E19 to which the cooperative material 1 is added to the paste material containing MgO. The bonding state is relatively good in Sample E18 to which 15 wt % of the cooperative material 1 is added. Among eight samples produced, not one was broken into two pieces.

In Sample E19 to which 25 wt % of the cooperative material 1 is added, disconnection of the electrode occurs.

In Sample E20 using the paste material to which 10 wt % of SrO and 5 wt % of the cooperative material 1 are added, diffusion of Cu occurs in the same way as in E13 but segregation cannot be observed.

In Sample E21 using the paste material to which 5 wt % of CaO and 5 wt % of the cooperative material 2 are added, diffusion of Cu occurs to a certain extent but segregation of Cu is not observed in the same way as in E1 of Embodiment 1.

As described above, the diffusion restrictive effect and the segregation preventive effect can be observed in the electrode paste material to which the cooperative material 1 or 2 is added.

Embodiment 12:

The process steps of Embodiment 11 are conducted in the same way to produce laminate products having a thickness of 10 mm by using Sample E22 tabulated in Table 3 with the exception that the degreasing process is employed. This degreasing process is conducted by leaving the samples standing at 500° C. for about one month in an $N_2$ atmosphere.

Figure 33:
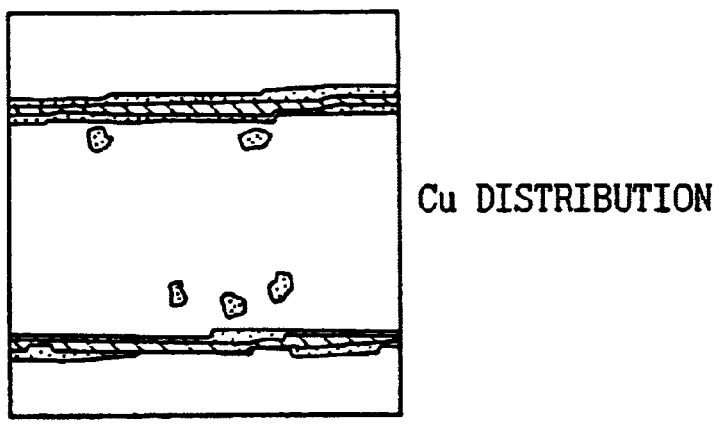
FIG. 33 is an explanatory view showing Cu distribution in a section of a laminate type dielectric device produced by using an electrode paste material of Sample E11 in Embodiment 9.

After each sample is degreased, the condition of the electrode is observed. As a result, it is found that though the outer peripheral portion is partially oxidized, the electrode is not oxidized (remains as Cu) as a whole. When each sample is baked in the same way as in Embodiment 11, diffusion of the component element Cu is partially observed in the same way as in FIG. 33, but segregation is not observed.

What is claimed is:

1. A laminate type dielectric device comprising:
   alternately laminated dielectric ceramic layers and electrode layers, wherein said electrode layers include an electrically conductive base metal material having a greater standard Gibbs free energy for the formation of metal oxides at a baking temperature than that of ceramic material included in said dielectric ceramic layers, and segregation of materials inclusive of said conductive base metal material does not occur at a portion sandwiched between adjacent positive and negative electrode layers in said dielectric ceramic layers.

2. A laminate type dielectric device according to claim 1, wherein at least a part of said electrically conductive base metal material is oxidized.

3. A laminate type dielectric device according to claim 1, wherein a bonding layer made of a material having the dielectric characteristics of said dielectric ceramic layers is sandwiched between one of said dielectric ceramic layers and one of said electrode layers.

4. A laminate type dielectric device according to claim 3, wherein said bonding layer is constituted by replacing a part

TABLE 3

| Sample No. | Organic vehicle and resin | CuO powder | Cu powder | Subtotal | Additives | Cooperative material | (wt %) |
|---|---|---|---|---|---|---|---|
| E16 | 35.0 | 35.0 | 30.0 | 100.0 | MgO:1 | Cooperative material 1:0.5 | |
| E17 | 35.0 | 35.0 | 30.0 | 100.0 | MgO:1 | Cooperative material 1:1 | |
| E18 | 33.0 | 36.0 | 31.0 | 100.0 | MgO:1 | Cooperative material 1:15 | |
| E19 | 34.0 | 35.0 | 31.0 | 100.0 | MgO:1 | Cooperative material 1:25 | |
| E20 | 35.0 | 34.0 | 31.0 | 100.0 | SrgO:10 | Cooperative material 1:5 | |
| E21 | 33.0 | 35.0 | 32.0 | 100.0 | CaO:5 | Cooperative material 2:5 | |
| E22 | 35.0 | — | 65.0 | 100.0 | MgO:1 | Cooperative material 1:1 | | of components constituting said one of said dielectric ceramic layers by other atoms.

5. A laminate type dielectric device according to claim 3, wherein said bonding layer is formed as Ca and is diffused into said one of said dielectric ceramic layers.

6. A laminate type dielectric device according to claim 3, wherein said electrically conductive base metal material is any one of Cu, Ni, or a mixture of Cu and Ni, and/or their alloys.

7. A laminate type dielectric device according to claim 1, wherein at least one of said dielectric ceramic layers comprises PZT as an oxide mainly having a Pb(Zr, Ti)$O_3$ type perovskite structure.

8. A laminate type dielectric device according to claim 7, wherein said electrically conductive base metal material is any one of Cu, a mixture of Cu and Ni and their alloys.

9. A laminate type dielectric device comprising:
alternately laminated dielectric ceramic layers and electrode layers, wherein said electrode layers are made of an electrically conductive base metal material having a greater standard Gibbs free energy, for the formation of a metal oxide at a baking temperature, than that of a ceramic material included in said dielectric ceramic layers, and wherein, when a reference straight line orthogonally crossing any one of said dielectric ceramic layers and two of the electrode layers which are above and below said one of said dielectric ceramic layers is assumed, a portion containing a Ca amount per unit volume greater than A+B, where A is a Ca amount per unit volume contained at a center point at the center of said one of said dielectric ceramic layers in a thickness-wise direction and B is a Ca amount per unit volume contained in either the above or below one of the electrode layers, exists on said reference straight line connecting said electrode layer containing B to said center point.

10. A laminate type dielectric device according to claim 9, wherein said electrically conductive base metal material is any one of Cu, Ni, a mixture of Cu and Ni and their alloys.

11. A laminate type dielectric device according to claim 9, wherein said dielectric ceramic layers comprise PZT as an oxide mainly having Pb(Zr, Ti)$O_3$ perovskite structure.

12. A laminate type dielectric device according to claim 11, wherein said electrically conductive base metal material is any one of Cu, a mixture of Cu and Ni and their alloys.

13. A laminate type dielectric device comprising:
alternately laminated dielectric ceramic layers and electrode layers, wherein said electrode layers are made of an electrically conductive base metal material having a greater standard Gibbs free energy, for the formation of a metal oxide at a baking temperature, than that of a ceramic material included in said dielectric ceramic layers, and at least one of said electrode layers contains Mg as a component element.

14. A laminate type dielectric device comprising:
alternately laminated dielectric ceramic layers and electrode layers, wherein said electrode layers are made of an electrically conductive base metal material having a greater standard Gibbs free energy, for the formation of a metal oxide at a baking temperature, than that of a ceramic material included in said dielectric ceramic layers, and wherein the Mg content per unit volume in said electrode layers is greater than a mean value of the Mg content per unit volume in said dielectric ceramic layers.

15. A laminate type dielectric device comprising:
alternately laminated dielectric ceramic layers and electrode layers, wherein said electrode layers are made of an electrically conductive base metal material having a greater standard Gibbs free energy, for the formation of a metal oxide at a baking temperature, than that of a ceramic material included in said dielectric ceramic layers, and wherein the Sr content per unit volume in said electrode layers is greater than a mean value of the Sr content per unit volume in said dielectric ceramic layers.

16. An electrode paste material for forming electrode layers in a laminate type dielectric device formed by alternately laminating dielectric ceramic layers and said electrode layers, wherein said electrode paste material comprises CuO as its principal component, and contains a melting restrictive material for restricting melting of a copper oxide to said dielectric ceramic layers during integral baking.

17. An electrode paste material according to claim 16, wherein said dielectric ceramic layers comprise PZT as an oxide mainly having a Pb(Zr, Ti)$O_3$ type perovskite structure.

18. An electrode paste material according to claim 16, wherein said melting restrictive material is a Ca compound.

19. An electrode paste material according to claim 18, wherein said Ca compound is $CaCO_3$ or CaO.

20. An electrode paste material according to claim 19, wherein, when the amount of said electrode layers exclusive of said $CaCO_3$ or CaO is 100 wt %, said $CaCO_3$ or CaO is contained within a range of an amount exceeding 1 wt % to 15 wt % calculated as CaO.

21. An electrode paste material according to claim 16, which further contains a cooperative material comprising at least one kind of the principal components included in said dielectric ceramic layers.

22. An electrode paste material according to claim 21, wherein the content of said cooperative material is less than 25 wt %.

23. An electrode paste material according to claim 21, wherein the content of said cooperative material is not greater than 15 wt %.

24. An electrode paste material according to claim 16, which further contains a cooperative material comprising substantially the same material as the material included in said dielectric ceramic layer.

25. An electrode paste material for forming electrode layers in a laminate type dielectric device formed by alternately laminating dielectric ceramic layers and said electrode layers, wherein said electrode paste material comprises CuO as its principal component, and contains a melting point raising material for raising a melting point of said copper oxide or a melting point of a compound between said copper oxide and ceramic material included in said dielectric ceramic layers, or melting points of materials mixed in said ceramic material and said copper oxide during integral baking.

26. An electrode paste material according to claim 25, wherein said melting point raising material is either a material which exhibits a change of a melting point of a complete solid solution system when it is reacted with a reaction material comprising a compound between said ceramic material and a copper oxide, or with a reaction material comprising a mixture of the copper oxide and a material mixed in said ceramic material, or with a reaction material comprising the copper oxide, and has a melting point higher than that of said reaction materials, or a material which exhibits a change of an eutectic type melting point when it is reacted with any one of said reaction materials, in which the eutectic point with said reaction materials exists within a range of an amount exceeding 0 wt % to 5 wt % calculated as the amount of the oxide of the component element of said reaction material, and which has a higher melting point than that of said reaction material.

27. An electrode paste material according to claim 25, wherein said melting point raising material is either a material which exhibits a change of a melting point of a complete solid solution system when it is reacted with a reaction material comprising a mixture of said ceramic material and a copper oxide at a temperature lower than 680° C., or with a reaction material comprising a mixture of the copper oxide and a material mixed in said ceramic material, or with a reaction material comprising the copper oxide, and has a higher melting point than that of said reaction materials, or a material which exhibits a change of an eutectic type melting point when it is reacted with any one of said reaction materials, in which the eutectic point with said reaction materials exists within a range of an amount exceeding 0 wt % to 5 wt % calculated as the amount of the copper oxide, and which changes to, or generates, a material having a higher melting point than that of said reaction materials.

28. An electrode paste material according to claim 25, wherein said melting point raising material is a Mg compound or a Sr compound.

29. An electrode paste material according to claim 28, wherein said Mg compound is MgO and said Sr compound is $SrCO_3$.

30. An electrode paste material according to claim 29, wherein, when the amount of said electrode paste material exclusive of MgO or said electrode paste material exclusive of MgO and said diffusion restrictive material is 100 wt %, said MgO is contained in an amount within the range of 0.2 wt % to 20 wt % calculated as CaO.

31. An electrode paste material according to claim 29, wherein, when the amount of said electrode paste material exclusive of said $SrCO_3$ or said electrode paste material exclusive of said $SrCO_3$ and said diffusion restrictive material is 100 wt %, said $SrCO_3$ is contained in an amount within the range of 10 to 15 wt % calculated as SrO.

32. An electrode paste material for forming electrode layers in a laminate type dielectric device formed by alternately laminating dielectric ceramic layers and said electrode layers, wherein said electrode paste material comprises CuO as its principal component, and contains a melting point raising material for raising a melting point of said copper oxide or a melting point of a compound between said copper oxide and ceramic material included in said dielectric ceramic layers, or melting points of materials mixed in said ceramic material and said copper oxide during integral baking, and a diffusion restrictive material for restricting diffusion of said copper oxide into said dielectric ceramic layers during integral baking, as the components of said diffusion restrictive material diffuse by themselves into said dielectric ceramic layers.

33. An electrode paste material according to claim 32, wherein said diffusion restrictive material is a Ca compound.

34. An electrode paste material according to claim 33, wherein said Ca compound is $CaCO_3$ or CaO.

35. An electrode paste material according to claim 34, wherein, when the amount of said electrode paste material exclusive of said $CaCO_3$ or CaO and said melting point raising material is 100 wt %, said $CaCO_3$ or CaO is contained within a range of an amount exceeding 1 wt % to 15 wt % calculated as CaO.

36. A laminate type dielectric device comprising:
alternately laminated dielectric ceramic layers and electrode layers, wherein said electrode layers are made of an electrically conductive base metal material having a greater standard Gibbs free energy, for the formation of a metal oxide at a baking temperature, than that of a ceramic material included in said dielectric ceramic layers, and wherein, when setting up a straight line as a reference which crosses orthogonally between one of said dielectric ceramic layers and two of said electrode layers, a portion containing a Ca content in a unit volume fraction greater than A+B, wherein A is a Ca content in a unit volume fraction contained at a center point at the center of said dielectric ceramic layers in a thickness-wise direction and B is a Ca content in a unit volume fraction contained in one of said two electrode layers, exists on said straight reference line connecting said electrode layer containing B to said center point.

37. An electrode paste material for forming electrode layers in a laminate type dielectric device formed by alternately laminating dielectric ceramic layers and said electrode layers, wherein said electrode paste material comprises CuO as its principal component, and contains a melting point raising material for restricting melting of said copper oxide to the dielectric ceramic layers during integral baking or for restricting eutectic reaction melting of said copper oxide with the dielectric ceramic layers during integral baking.

* * * * *